United States Patent
Takamine et al.

(10) Patent No.: US 10,141,913 B2
(45) Date of Patent: Nov. 27, 2018

(54) MULTIPLEXER, TRANSMISSION APPARATUS, AND RECEPTION APPARATUS

(71) Applicant: Murata Manufacturing Co., Ltd., Nagaokakyo-shi, Kyoto-fu (JP)

(72) Inventors: Yuichi Takamine, Nagaokakyo (JP); Toshimaro Yoneda, Nagaokakyo (JP); Noriyoshi Ota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/893,759

(22) Filed: Feb. 12, 2018

(65) Prior Publication Data

US 2018/0234079 A1 Aug. 16, 2018

(30) Foreign Application Priority Data

Feb. 13, 2017 (JP) .................. 2017-024258
Jan. 15, 2018 (JP) .................. 2018-004030

(51) Int. Cl.
| | | |
|---|---|---|
| *H03H 9/64* | (2006.01) | |
| *H03H 7/38* | (2006.01) | |
| *H03H 7/46* | (2006.01) | |
| *H03H 9/72* | (2006.01) | |
| *H04B 1/40* | (2015.01) | |
| *H03H 9/145* | (2006.01) | |

(52) U.S. Cl.
CPC ............ *H03H 9/6483* (2013.01); *H03H 7/38* (2013.01); *H03H 7/46* (2013.01); *H03H 9/145* (2013.01); *H03H 9/72* (2013.01); *H04B 1/40* (2013.01)

(58) Field of Classification Search
CPC ............ H03H 9/72; H03H 9/64; H03H 9/008; H03H 9/6433; H03H 9/725; H03H 9/70; H03H 9/706
See application file for complete search history.

(56) References Cited

U.S. PATENT DOCUMENTS

| | | | |
|---|---|---|---|
| 2006/0192633 A1* | 8/2006 | Kishimoto ........... | H03H 9/0576 333/133 |
| 2007/0030096 A1* | 2/2007 | Nishihara .............. | H03H 9/605 333/133 |
| 2008/0024243 A1* | 1/2008 | Iwaki ..................... | H03H 9/706 333/133 |

(Continued)

FOREIGN PATENT DOCUMENTS

| | | |
|---|---|---|
| JP | 2006-345027 A | 12/2006 |
| WO | 2016/208670 A1 | 12/2016 |

*Primary Examiner* — Andrew Lee
(74) *Attorney, Agent, or Firm* — Keating & Bennett, LLP

(57) ABSTRACT

A multiplexer includes filters and a common terminal connected to an antenna element by a connection path, a first inductance element being connected between the connection path and a reference terminal. A terminal closer to the antenna element among an input terminal and an output terminal of one filter among the filters is connected to a parallel resonator and is connected to the common terminal with a second inductance element interposed therebetween. A terminal closer to the antenna element among an input terminal and an output terminal of each of other filters other than the one filter among the filters is connected to the common terminal and a series resonator.

20 Claims, 32 Drawing Sheets

(56) References Cited

U.S. PATENT DOCUMENTS

| | | | |
|---|---|---|---|
| 2008/0150652 A1* | 6/2008 | Itou | H03H 9/725 |
| | | | 333/133 |
| 2011/0128092 A1* | 6/2011 | Fritz | H03H 9/706 |
| | | | 333/133 |
| 2012/0032753 A1* | 2/2012 | Nishimura | H03H 9/008 |
| | | | 333/133 |
| 2012/0086521 A1* | 4/2012 | Tsurunari | H03H 9/02834 |
| | | | 333/133 |
| 2013/0314173 A1* | 11/2013 | Inoue | H03H 9/70 |
| | | | 333/133 |
| 2014/0009247 A1* | 1/2014 | Moriya | H03H 9/725 |
| | | | 333/133 |
| 2015/0070227 A1* | 3/2015 | Kishino | H03H 9/725 |
| | | | 343/722 |
| 2016/0156334 A1* | 6/2016 | Nakagawa | H03H 9/6469 |
| | | | 333/133 |
| 2016/0173062 A1* | 6/2016 | Takamine | H03H 9/6433 |
| | | | 333/133 |

* cited by examiner

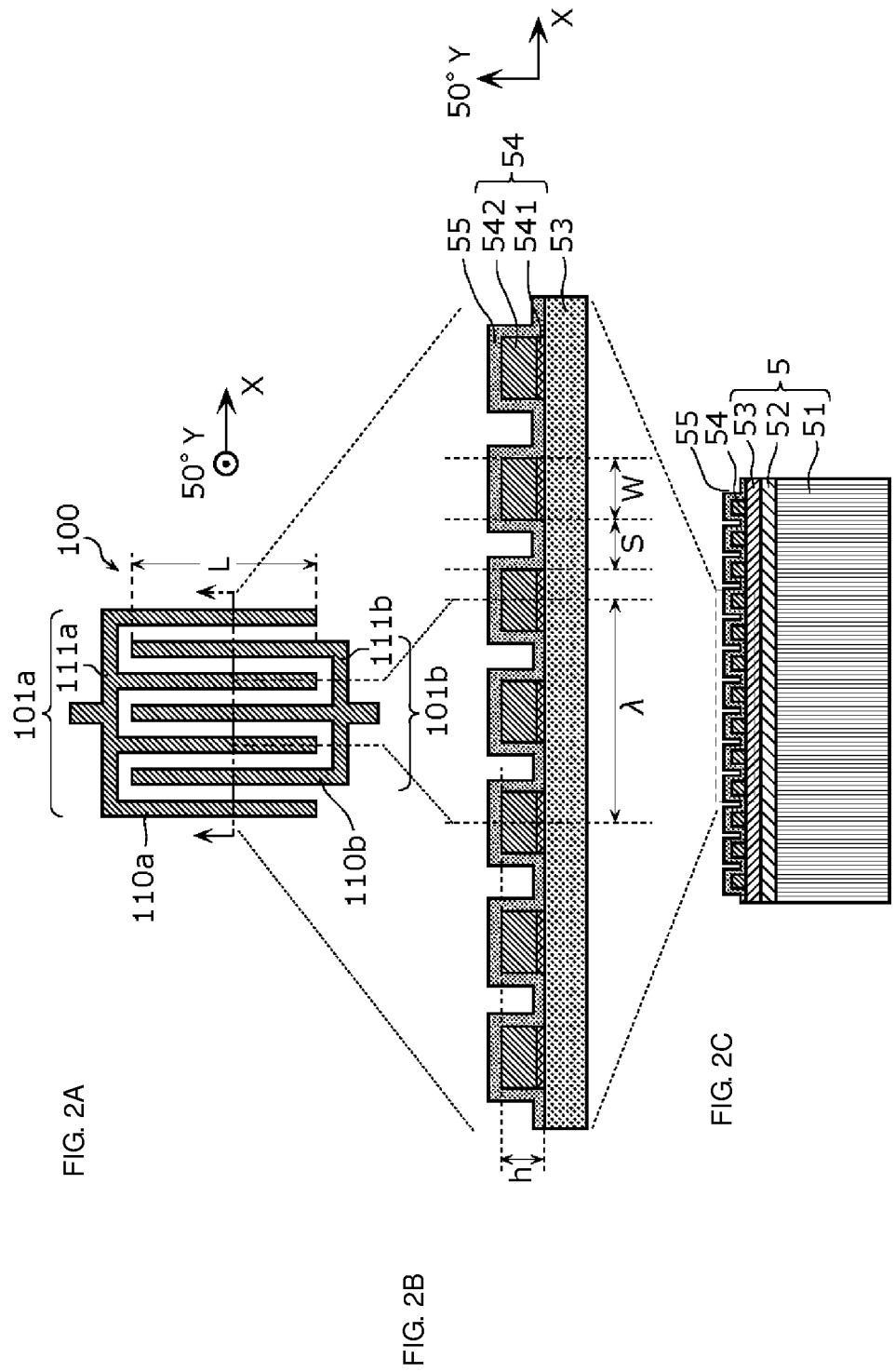

Band25Tx

Band25Rx

Band66Tx

Band66Rx

FIG. 8C
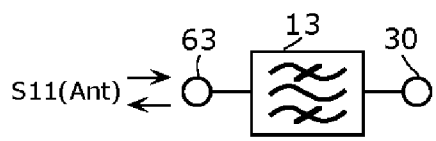
Band66Tx
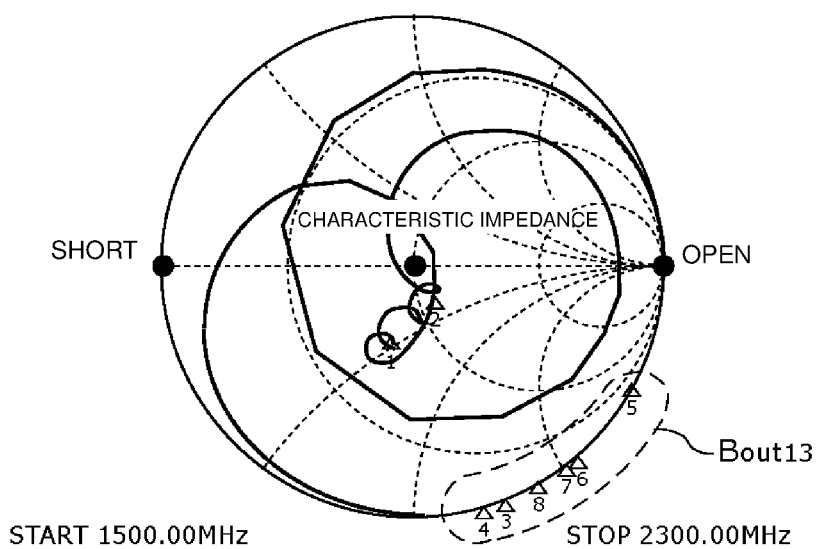
| MARKER 1 : Band66Tx(1710MHz) |
| MARKER 2 : Band66Tx(1780MHz) |
| MARKER 3 : Band66Rx(2110MHz) |
| MARKER 4 : Band66Rx(2200MHz) |
| MARKER 5 : Band25Tx(1850MHz) |
| MARKER 6 : Band25Tx(1915MHz) |
| MARKER 7 : Band25Rx(1930MHz) |
| MARKER 8 : Band25Rx(1995MHz) |

FIG. 8D
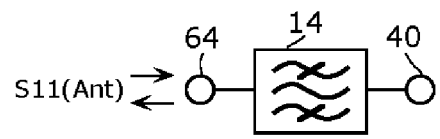
Band4Rx
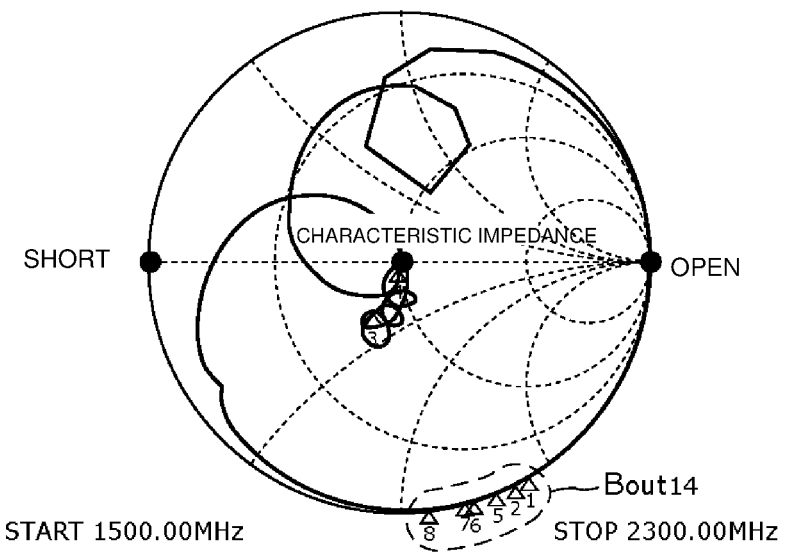
| MARKER 1 : Band66Tx(1710MHz) |
| MARKER 2 : Band66Tx(1780MHz) |
| MARKER 3 : Band66Rx(2110MHz) |
| MARKER 4 : Band66Rx(2200MHz) |
| MARKER 5 : Band25Tx(1850MHz) |
| MARKER 6 : Band25Tx(1915MHz) |
| MARKER 7 : Band25Rx(1930MHz) |
| MARKER 8 : Band25Rx(1995MHz) |

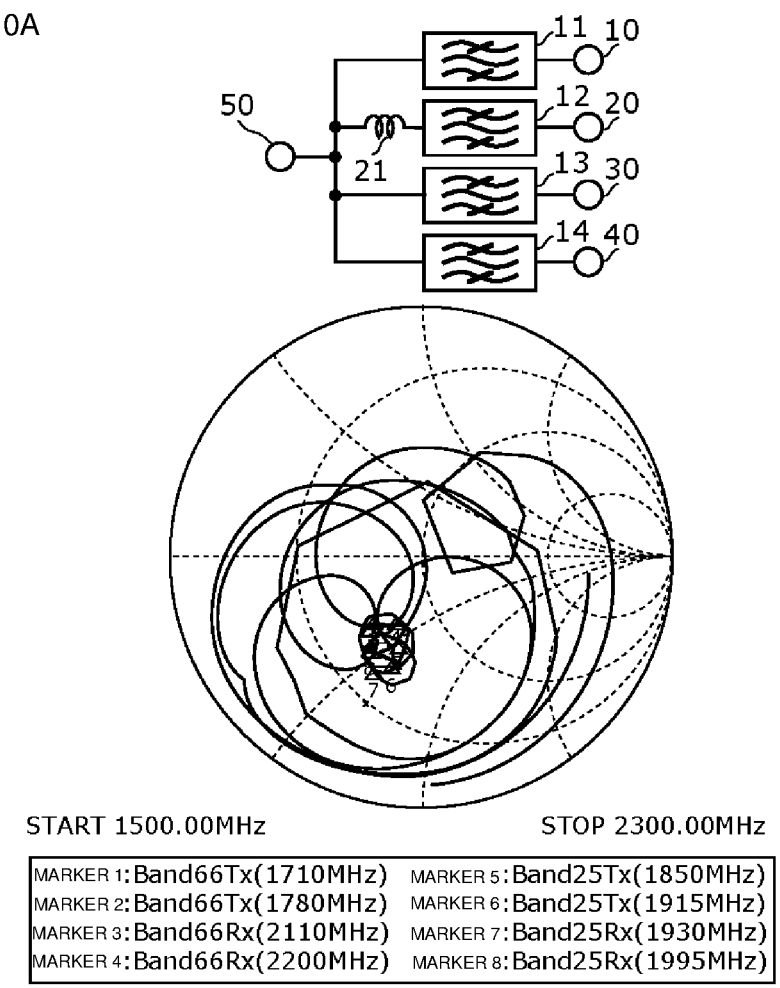

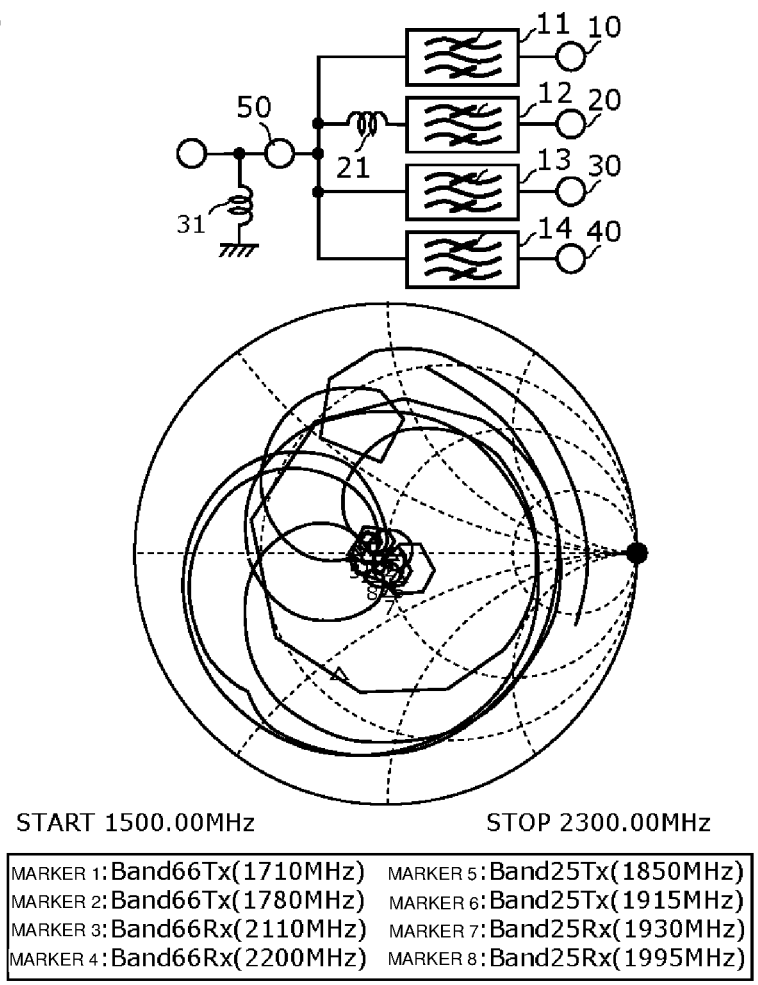

START 1500.00MHz      STOP 2300.00MHz

CHARACTERISTIC
IMPEDANCE 40Ω

START 1500.00MHz      STOP 2300.00MHz

CHARACTERISTIC
IMPEDANCE 50Ω

START 1500.00MHz   STOP 2300.00MHz

CHARACTERISTIC
IMPEDANCE 60Ω

Band25Tx

Band25Rx

Band66Tx

Band66Rx

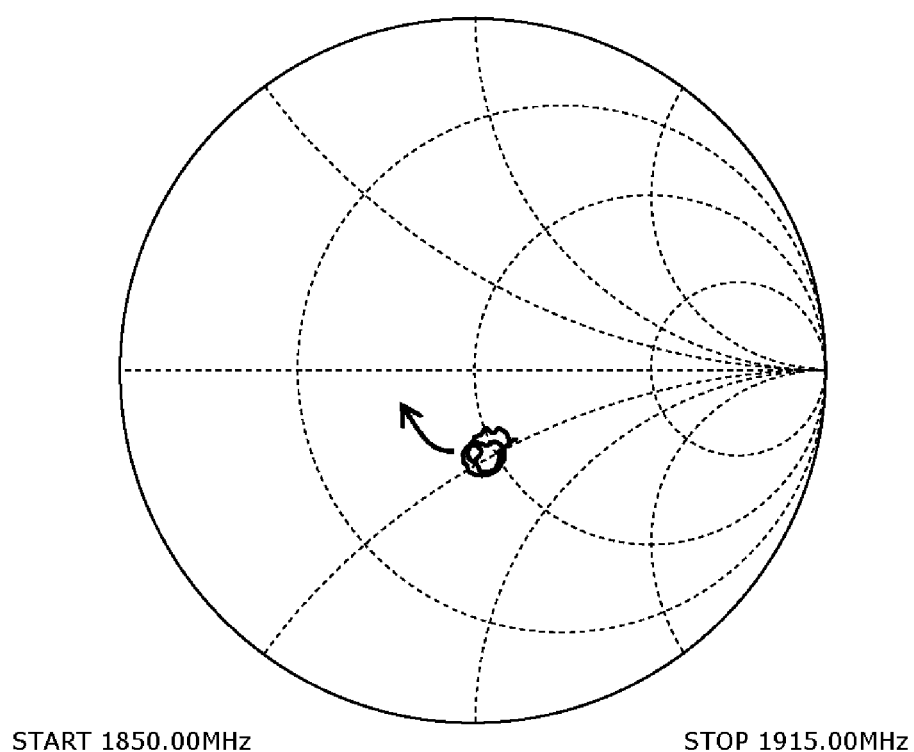

MULTIPLEXER, TRANSMISSION APPARATUS, AND RECEPTION APPARATUS

CROSS REFERENCE TO RELATED APPLICATIONS

This application claims the benefit of priority to Japanese Patent Application No. 2017-024258 filed on Feb. 13, 2017 and Japanese Patent Application No. 2018-004030 filed on Jan. 15, 2018. The entire contents of these applications are hereby incorporated herein by reference.

BACKGROUND OF THE INVENTION

1. Field of the Invention

The present invention relates to a multiplexer, a transmission apparatus, and a reception apparatus that include elastic wave filters.

2. Description of the Related Art

Recent cellular phones are required to support a plurality of frequency bands and a plurality of wireless communication schemes, so-called, multi-bands and multi-modes with a single terminal. To meet such requirements, a multiplexer that demultiplexes a high-frequency signal having a plurality of radio carrier frequencies is disposed right under a single antenna. Elastic wave filters that characteristically have low loss in a pass band and sharp band pass characteristics around the pass band are used as a plurality of band pass filters included in such a multiplexer.

International Publication No. 2016/208670 discloses a surface acoustic wave (SAW) device (SAW duplexer) including a plurality of SAW filters that are connected to one another. Specifically, an inductance element is connected in series between an antenna element and a connection path of an antenna terminal and reception and transmission SAW filters to achieve impedance matching between the antenna element and the antenna terminal. With this inductance element, complex impedance obtained by viewing capacitive SAW filters from the antenna terminal to which the capacitive SAW filters are connected is successfully adjusted to approach the characteristic impedance. In this way, degradation of insertion loss is successfully prevented.

However, in the case of impedance matching of the related art that is achieved by connecting an inductance element in series to an antenna terminal, the Q factor of the series-connected inductance element greatly influences insertion loss. For example, when an inductance element having a low Q factor such as an inductance element disposed in a package is used, insertion loss degrades in the pass band of each filter. In particular, insertion loss of a filter (Band 25 reception filter, for example) for which an inductance element is connected in series between the filter and the antenna terminal defining and functioning as a common terminal degrades in the pass band more than insertion loss of a filter not including such an inductance element.

SUMMARY OF THE INVENTION

Preferred embodiments of the present invention provide multiplexers, transmission apparatuses, and reception apparatuses that are able to significantly reduce insertion loss in a pass band of each filter even when an inductance element with a low Q factor is included.

According to a preferred embodiment of the present invention, a multiplexer that transmits and receives a plurality of high-frequency signal via an antenna element includes a plurality of elastic wave filters that provide pass bands different from one another, and a common terminal that is connected to the antenna element by a connection path, a first inductance element being connected between the connection path and a reference terminal, in which each of the plurality of elastic wave filters includes at least one of a series resonator connected between an input terminal and an output terminal of the elastic wave filter, and a parallel resonator connected between the reference terminal and a connection path connecting the input terminal and the output terminal to each other, a terminal closer to the antenna element among the input terminal and the output terminal of one elastic wave filter among the plurality of elastic wave filters is connected to the parallel resonator and is connected to the common terminal with a second inductance element interposed therebetween, and a terminal closer to the antenna element among the input terminal and the output terminal of each of other elastic wave filters other than the one elastic wave filter among the plurality of elastic wave filters is connected to the common terminal and the series resonator.

With the features described above, since the first inductance element is connected between the reference terminal and the connection path of the common terminal and the antenna element and is not connected in series between the common terminal and the antenna element, there is no resistance component that is connected in series to each of the filters. Thus, the influence of the Q factor of the first inductance element on impedance matching is small. Consequently, insertion loss in the pass band of each elastic wave filter included in the multiplexer is significantly reduced even when an inductance element with a low Q factor is included.

In addition, the second inductance element may be connected to the terminal of the one elastic wave filter that is closer to the antennal element, so that impedance in bands other than a pass band of the one elastic wave filter may become inductive.

With the features described above, complex impedance is successfully adjusted to characteristic impedance easily by the relationship of complex conjugates. Thus, insertion loss in the pass band of each elastic wave filter included in the multiplexer is easily significantly reduced.

In addition, the first inductance element and the second inductance element may be included in a mounting substrate on which the plurality of elastic wave filters are mounted.

With the features described above, insertion loss in the pass band of each elastic wave filter included in the multiplexer is significantly reduced even when an inductance element disposed in the mounting substrate and with a low Q factor is included.

In addition, a direction in which a wiring defining the first inductance element is wound may be identical to a direction in which a wiring defining the second inductance element is wound in the mounting substrate.

With the features described above, since mutual inductance is caused between the first inductance element and the second inductance element, areas occupied by the first inductance element and the second inductance element in plan view are significantly reduced on the mounting substrate in which the first inductance and the second inductance are disposed.

In addition, characteristic impedance $R+jX$ [Ω] viewed from the common terminal of all the plurality of elastic wave filters before the first inductance element is connected may satisfy about 40≤R≤about 60 and about −40≤X<about 0.

With the features described above, impedance matching is successfully provided without degrading insertion loss of each elastic wave filter.

In addition, each of another elastic wave filter that is to be isolated from the one elastic wave filter among the plurality of elastic wave filters may include a third inductance element connected in series or parallel to a terminal opposite to the terminal closer to the antenna element.

With the features described above, isolation of the elastic wave filter including the third inductance element is successfully increased by coupling between the third inductance element and the other inductance elements.

In addition, complex impedance in a predetermined pass band provided when the one elastic wave filter is viewed through the second inductance element in a state in which the second inductance element and the terminal closer to the antenna element among the input terminal and the output terminal of the one elastic wave filter are connected in series to each other and complex impedance in the predetermined pass band provided when the other elastic wave filters other than the one elastic wave filter are viewed from the terminals closer to the antenna element to which the common terminal is connected in a state in which the terminals closer to the antenna element among the input terminals and the output terminals of the other elastic wave filters other than the one elastic wave filter are connected to the common terminal may include a relationship of complex conjugates.

With the features described above, complex impedance viewed from the common terminal of the multiplexer that includes a circuit including a combination of a circuit in which the second inductance element and the one elastic wave filter are connected in series to each other and a circuit in which the other elastic wave filters other than the one elastic wave filter are connected to the common terminal to be in parallel to one another is successfully adjusted to match characteristic impedance while ensuring low insertion losses in the pass bands. In addition, complex impedance of the multiplexer viewed from the common terminal is successfully fine-adjusted toward an inductive side by connecting the first inductance element with a small inductance value in parallel between the common terminal and the antenna element.

In addition, a first filter with the highest center frequency among the plurality of elastic wave filters may include the shortest wiring disposed between the first filter and the common terminal in the mounting substrate, and a second filter with the lowest center frequency among the other elastic wave filters other than the one elastic wave filter among the plurality of elastic wave filters may include the longest wiring disposed between the second filter and the common terminal in the mounting substrate.

The influence of an increase in the length of the wiring disposed between the second filter with the lowest center frequency and the common terminal on insertion loss of the second filter is small, and insertion loss of the first filter with the highest center frequency is sensitively influenced by the length of the wiring disposed between the first filter and the common terminal. Thus, with the features described above, a multiplexer in which good impedance matching is provided at the common terminal and the first filter with the highest center frequency includes good insertion loss is successfully implemented.

In addition, when the wiring of the second filter with the lowest center frequency is long, the frequency of the attenuation pole that occurs on the higher frequency side of the pass band due to the inductance component and the capacitance component in the mounting substrate moves to the lower frequency side. Thus, with the features described above, isolation characteristics are significantly improved between the second filter and another filter with a higher center frequency than the second filter.

In addition, a length of the wiring of the second filter in the mounting substrate may be less than about λ/4.

With the features described above, the occurrence of a standing wave is significantly reduced or prevented in the wiring disposed between the second filter with the lowest center frequency and the common terminal.

In addition, a piezoelectric substrate included in each of the plurality of elastic wave filters may include a piezoelectric film including interdigital transducer electrodes on one surface thereof, a high-acoustic-velocity supporting substrate through which a bulk wave propagates at an acoustic velocity higher than an acoustic velocity of an elastic wave that propagates through the piezoelectric film, and a low-acoustic-velocity film that is disposed between the high-acoustic-velocity supporting substrate and the piezoelectric film and through which a bulk wave propagates at an acoustic velocity lower than the acoustic velocity of the elastic wave that propagates through the piezoelectric film.

A circuit element, for example, an inductance element or a capacitance element, is added to provide impedance matching between the plurality of elastic wave filters, for example, in the case where the second inductance element is connected in series to the common terminal of the one elastic wave filter. In such a case, the Q factor of each resonator is expected to equivalently reduce. However, with the multi-layer structure of the piezoelectric substrate, the Q factor of each resonator is successfully maintained at a high value. Thus, an elastic wave filter providing a low loss in the pass band is successfully created.

In addition, the multiplexer may include, as the plurality of elastic wave filter, a first elastic wave filter that provides a first pass band and that outputs a transmission signal to the antenna element, a second elastic wave filter that provides a second pass band adjacent to or in a vicinity of the first pass band and that receives a reception signal from the antenna element, a third elastic wave filter that provides a third pass band lower than the first pass band and the second pass band and that outputs a transmission signal to the antenna element, and a fourth elastic wave filter that provides a fourth pass band higher than the first pass band and the second pass band and that receives a reception signal from the antenna element; and the one elastic wave filter to which the second inductance element is connected in series may be at least one of the second elastic wave filter and the fourth elastic wave filter.

In addition, according to a preferred embodiment of the present invention, a transmission apparatus that receives a plurality of high-frequency signals with carrier frequency bands different from one another, performs filtering on the plurality of high-frequency signals, and wirelessly transmits a resultant signal from a single antenna element includes a plurality of transmission elastic wave filters each of which receives the plurality of high-frequency signals from a transmission circuit and passes therethrough a signal of a predetermined frequency band, and a common terminal connected to the antenna element by a connection path, a first inductance element being connected between the connection path and a reference terminal, in which each of the plurality of transmission elastic wave filters includes at least one of a series resonator connected between an input terminal and an output terminal of the transmission elastic wave filter, and a parallel resonator connected between the reference terminal and a connection path connecting the input terminal and the output terminal to each other, an output terminal of one transmission elastic wave filter among the plurality of transmission elastic wave filters is connected to the parallel resonator and is connected to the common terminal with a second inductance element interposed therebetween, the second inductance element being connected to the output terminal and the common terminal, and an output terminal of each of other transmission elastic wave filters other than the one transmission elastic wave filter is connected to the common terminal and is connected to the series resonator among the series resonator and the parallel resonator.

In addition, according to a preferred embodiment of the present invention, a reception apparatus that receives a plurality of high-frequency signals with carrier frequency bands different from one another via an antenna element, performs demultiplexing on the plurality of high-frequency signals, and outputs resultant signals to a reception circuit includes a plurality of reception elastic wave filters each of which receives the plurality of high-frequency signals from the antenna element and passes therethrough a signal of a predetermined frequency band, and a common terminal connected to the antenna element by a connection path, a first inductance element being connected between the connection path and a reference terminal, in which each of the plurality of reception elastic wave filters includes at least one of a series resonator connected between an input terminal and an output terminal of the reception elastic wave filter, and a parallel resonator connected between the reference terminal and an electrical path connecting the input terminal and the output terminal to each other, an input terminal of one reception elastic wave filter among the plurality of reception elastic wave filters is connected to the parallel resonator and is connected to the common terminal with a second inductance element interposed therebetween, the second inductance element being connected to the input terminal and the common terminal, and an input terminal of each of other reception elastic wave filters other than the one reception elastic wave filter is connected to the common terminal and is connected to the series resonator among the series resonator and the parallel resonator.

In addition, according to a preferred embodiment of the present invention, an impedance matching method for a multiplexer that transmits and receives a plurality of high-frequency signals via an antenna element, includes a step of adjusting a plurality of elastic wave filters with pass bands different from one another that provides, when one elastic wave filter among the plurality of elastic wave filters is viewed from one of an input terminal and an output terminal of the one elastic wave filter, a complex impedance in the pass bands of other elastic wave filters other than the one elastic wave filter among the plurality of elastic wave filters is in a short state and, when each of the other elastic wave filters is viewed from one of an input terminal and an output terminal of the other elastic wave filter, complex impedance in the pass band of the other elastic wave filter is in an open state; a step of adjusting an inductance value of a filter-adjustment inductance element that provides a complex impedance when the one elastic wave filter is viewed from the filter-adjustment inductance element side in a case where the filter-adjustment inductance element is connected in series to the one elastic wave filter and a complex impedance when the other elastic wave filters are viewed from the common terminal in a case where the other elastic wave filters are connected to the common terminal to be in parallel to one another provide a relationship of complex conjugates; and a step of adjusting an inductance value of an antenna-adjustment inductance element connected between the reference terminal and a connection path connecting the antenna element and the common terminal to each other that provides a complex impedance, viewed from the common terminal, of a combined circuit in which the one elastic wave filter is connected to the common terminal with the filter-adjustment inductance element interposed therebetween and the other elastic wave filters are connected to the common terminal to be in parallel to one another matches characteristic impedance, in which in the step of adjusting the plurality of elastic wave filters, among the plurality of elastic wave filters each of which includes at least one of a series resonator connected between an input terminal and an output terminal of the elastic wave filter, and a parallel resonator connected between the reference terminal and an electrical path connecting the input terminal and the output terminal to each other, the parallel resonator is connected to the filter-adjustment inductance element in the one elastic wave filter, and the series resonator is connected to the common terminal among the parallel resonator and the series resonators in each of the other elastic wave filters.

With the features described above, a low-loss transmission apparatus and a low-loss reception apparatus in which insertion loss in a pass band of each filter is significantly reduced are provided even when an inductance element with a low Q factor is included.

With the multiplexer, the transmission apparatus, and the reception apparatus according to the preferred embodiments of the present invention, insertion loss in the pass band of each filter is significantly reduced even when an inductance element with a low Q factor is included.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2C are a plan view and cross-sectional views schematically illustrating a resonator of a SAW filter according to the first preferred embodiment of the present invention.

FIG. 8C is a Smith chart illustrating complex impedance viewed from a transmission output terminal of the Band 66 transmission filter according to the first preferred embodiment of the present invention alone.

FIG. 8D is a Smith chart illustrating complex impedance viewed from a reception input terminal of the Band 66 reception filter according to the first preferred embodiment of the present invention alone.

FIG. 10A is a Smith chart illustrating complex impedance viewed from a common terminal of a circuit in which the four filters according to the first preferred embodiment of the present invention are connected to the common terminal to be in parallel to one another.

FIG. 10B is a Smith chart illustrating complex impedance in the case where the four filters according to the first preferred embodiment of the present invention are connected to the common terminal to be in parallel to one another and an inductance element is connected between a reference terminal and a connection path of the common terminal and an antenna element.

FIG. 21 is a Smith chart illustrating a change in complex impedance viewed from a common terminal of the multiplexer when the length of a wiring disposed between the common terminal and each of the filters is changed.

DETAILED DESCRIPTION OF THE PREFERRED EMBODIMENTS

Figure 1:
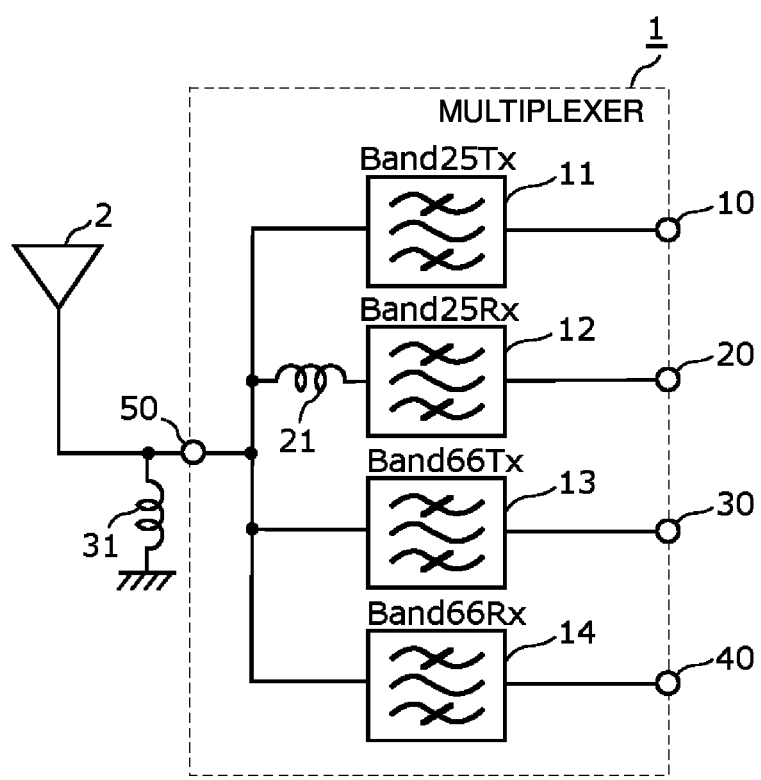
FIG. 1 is a diagram illustrating a circuit of a multiplexer according to a first preferred embodiment of the present invention.

Preferred embodiments of the present invention will be described in detail below with reference to the drawings. Each of the preferred embodiments described below is a general or specific example. Numeric values, shapes, materials, components, and arrangements and connections of the components included in the preferred embodiments below are merely examples and do not limit the present invention. Among the components described in the following preferred embodiments, components that are not recited in the independent claims will be described as optional components. The dimensions and dimensional ratios of the components in the drawings are not necessarily precise.

First Preferred Embodiment

In a first preferred embodiment of the present invention, a quadplexer for Band 25 (transmission pass band: about 1850 MHz to about 1915 MHz, reception pass band: about 1930 MHz to about 1995 MHz) and Band 66 (transmission pass band: about 1710 MHz to about 1780 MHz, reception pass band: about 2010 MHz to about 2200 MHz) according to the Time Division Long Term Evolution (TD-LTE) standard will be described as an example.

That is, a multiplexer 1 according to the first preferred embodiment is a quadplexer in which a Band 25 duplexer and a Band 66 duplexer are connected to each other via a common terminal 50.

FIG. 1 is a diagram illustrating a circuit of the multiplexer 1 according to the first preferred embodiment. As illustrated in FIG. 1, the multiplexer 1 includes transmission filters 11 and 13, reception filters 12 and 14, an inductance element 21 (defining and functioning as a second inductance element), the common terminal 50, transmission input terminals 10 and 30, and reception output terminals 20 and 40. The multiplexer 1 is connected to an antenna element 2 via the common terminal 50. An inductance element 31 (defining and functioning as a first inductance element) is connected between ground defining and functioning as a reference terminal and a connection path of the common terminal 50 and the antenna element 2. Note that the inductance element 31 may be included in the multiplexer 1 as a single package or may be disposed outside the multiplexer 1, for example, on or in a substrate on which at least one of the transmission filters 11 and 13 and the reception filters 12 and 14 included in the multiplexer 1 is disposed.

The transmission filter 11 is an unbalanced-input-unbalanced-output band pass filter (defining and functioning as a first elastic wave filter) that receives a transmission wave generated by a transmission circuit (for example, a radio frequency integrated circuit (RFIC)) via the transmission input terminal 10, performs filtering on the transmission wave by a transmission pass band of Band 25 (about 1850

MHz to about 1915 MHz: defining and functioning as a first pass band), and outputs the resultant transmission wave to the common terminal 50.

The reception filter 12 is an unbalanced-input-unbalanced-output band pass filter (defining and functioning as a second elastic wave filter) that receives a reception wave input from the common terminal 50, performs filtering on the reception wave by a reception pass band of Band 25 (about 1930 MHz to about 1995 MHz: defining and functioning as a second pass band), and outputs the resultant reception wave to the reception output terminal 20. In addition, the inductance element 21 is connected in series between the reception filter 12 and the common terminal 50. As a result of the inductance element 21 being connected on the common terminal 50 side of the reception filter 12, impedances of the transmission filters 11 and 13 and the reception filter 14, which provide pass bands outside the pass band of the reception filter 12, become inductive.

The transmission filter 13 is a unbalanced-input-unbalanced-output band pass filter (defining and functioning as a third elastic wave filter) that receives a transmission wave generated by a transmission circuit (for example, an RFIC) via the transmission input terminal 30, performs filtering on the transmission wave by a transmission pass band of Band 66 (about 1710 MHz to about 1780 MHz: defining and functioning as a third pass band), and outputs the resultant transmission wave to the common terminal 50.

The reception filter 14 is an unbalanced-input-unbalanced-output band pass filter (defining and functioning as a fourth elastic wave filter) that receives a reception wave input from the common terminal 50, performs filtering on the reception wave by a reception pass band of Band 66 (about 2010 MHz to about 2200 MHz: defining and functioning as a fourth pass band), and outputs the resultant reception wave to the reception output terminal 40.

The transmission filters 11 and 13 and the reception filter 14 are directly connected to the common terminal 50.

Note that the position at which the inductance element is connected is not limited to the position between the reception filter 12 and the common terminal 50. The inductance element 21 may be connected in series between the reception filter 14 and the common terminal 50.

Now, a structure of SAW resonators included in the transmission filters 11 and 13 and the reception filters 12 and 14 will be described.

FIGS. 2A to 2C are diagrams schematically illustrating a resonator included in a SAW filter according to the first preferred embodiment. Specifically, FIG. 2A is a plan view, and FIGS. 2B and 2C are cross-sectional views taken along the dot-dash line illustrated in FIG. 2A. FIGS. 2A to 2C are a schematic plan view and schematic cross-sectional views illustrating a structure of a series resonator included in the transmission filter 11 among a plurality of resonators included in the transmission filters 11 and 13 and the reception filters 12 and 14. Note that the series resonator illustrated in FIGS. 2A to 2C is included only as one example of a structure of the plurality of resonators, and the number and length of electrode fingers of each electrode are not limited to the illustrated number and length.

A resonator 100 included in each of the transmission filters 11 and 13 and the reception filters 12 and 14 includes a piezoelectric substrate 5 and interdigital transducer (IDT) electrodes 101a and 101b including a comb shape.

A pair of IDT electrodes 101a and 101b that oppose each other as illustrated in FIG. 2A are disposed on the piezoelectric substrate 5. The IDT electrode 101a includes a plurality of electrode fingers 110a that are parallel or substantially parallel to one another and a busbar electrode 111a that connects the plurality of electrode fingers 110a to one another. The IDT electrode 101b includes a plurality of electrode fingers 110b that are parallel or substantially parallel to one another and a busbar electrode 111b that connects the plurality of electrode fingers 110b to one another. The pluralities of electrode fingers 110a and 110b are provided in a direction perpendicular or substantially perpendicular to an X-axis direction.

IDT electrodes 54, which are defined by the pluralities of electrode fingers 110a and 110b and the busbar electrodes 111a and 111b, include a structure in which a close-contact layer 541 and a main electrode layer 542 are stacked as illustrated in FIG. 2B.

The close-contact layer 541 is a layer that strengthens the contact between the piezoelectric substrate 5 and the main electrode layer 542. For example, Ti is included as a material of the close-contact layer 541. The close-contact layer 541 includes a film thickness of about 12 nm, for example.

For example, Al containing about 1% of Cu is included as a material of the main electrode layer 542. The main electrode layer 542 includes a film thickness of about 162 nm, for example.

A protection layer 55 covers the IDT electrodes 101a and 101b. The protection layer 55 is a layer intended to protect the main electrode layer 542 from the outside environment, adjust the frequency-temperature characteristics, and increase the humidity resistance. The protection layer 55 is a film including silicon dioxide as a primary component, for example. The protection layer 55 is disposed on a piezoelectric film 53 and the IDT electrodes 54 along the uneven surface defined by the piezoelectric film 53 and the IDT electrodes 54 and includes a thickness of about 25 nm, for example.

Materials of the close-contact layer 541, the main electrode layer 542, and the protection layer 55 are not limited to the materials described above. In addition, the IDT electrodes 54 need not necessarily include the layered structure. The IDT electrodes 54 may include a metal or alloy of Ti, Al, Cu, Pt, Au, Ag, or Pd, for example, or of a plurality of multilayer bodies that include the metal or alloy. In addition, the protection layer 55 may be omitted.

A layered structure of the piezoelectric substrate 5 will be described next.

As illustrated in FIG. 2C, the piezoelectric substrate 5 includes a high-acoustic-velocity supporting substrate 51, a low-acoustic-velocity film 52, and the piezoelectric film 53. The piezoelectric substrate 5 includes a structure in which the high-acoustic-velocity supporting substrate 51, the low-acoustic-velocity film 52, and the piezoelectric film 53 are stacked in this order.

The piezoelectric film 53 includes 50° Y-X LiTaO$_3$ piezoelectric single crystal (i.e., lithium tantalate single crystal that is cut at a plane including, as the normal, an axis rotated from the Y axis by 50° with the X axis being the central axis and through which a surface acoustic wave propagates in the X-axis direction) or piezoelectric ceramics. The piezoelectric film 53 includes a thickness of about 600 nm, for example. Note that the piezoelectric film 53 including 42°-to-45° Y-X LiTaO$_3$ piezoelectric single crystal or piezoelectric ceramics is included in the transmission filter 13 and the reception filter 14.

The high-acoustic-velocity supporting substrate 51 is a substrate that supports the low-acoustic-velocity film 52, the piezoelectric film 53, and the IDT electrodes 54. The high-acoustic-velocity supporting substrate 51 is a substrate through which a bulk wave propagates at an acoustic velocity higher than that of an elastic wave, for example, a surface acoustic wave or a boundary wave, that propagates through the piezoelectric film 53. The high-acoustic-velocity supporting substrate 51 confines a surface acoustic wave within a portion where the piezoelectric film 53 and the low-acoustic-velocity film 52 are stacked so that the surface acoustic wave does not leak to a portion below the high-acoustic-velocity supporting substrate 51. The high-acoustic-velocity supporting substrate 51 is, for example, a silicon substrate and includes a thickness of about 200 µm, for example.

The low-acoustic-velocity film 52 is a film through which a bulk wave propagates at an acoustic velocity lower than that of an elastic wave that propagates through the piezoelectric film 53. The low-acoustic-velocity film 52 is disposed between the piezoelectric film 53 and the high-acoustic-velocity supporting substrate 51. With this structure and a property of an elastic wave that energy of an elastic wave concentrates at a low-acoustic-velocity medium, energy of a surface acoustic wave is significantly reduced or prevented from leaking to outside of the IDT electrodes 54. The low-acoustic-velocity film 52 is a film including silicon dioxide as a primary component, for example, and includes a thickness of about 670 nm, for example.

The above-described layered structure of the piezoelectric substrate 5 is able to significantly increase the Q factor at a resonant frequency and an anti-resonant frequency, compared with a structure of the related art in which a piezoelectric substrate defined by a single layer is included. That is, since SAW resonators with a high Q factor are successfully fabricated, a filter providing small insertion loss is able to be fabricated by SAW resonators.

A circuit element, for example, an inductance element or a capacitance element, is added to provide impedance matching between a plurality of SAW filters, for example, in the case where the inductance element 21 for impedance matching is connected in series on the common terminal 50 side of the reception filter 12. As a result, the Q factor of the resonator 100 is expected to equivalently reduce. However, even in such a case, the above-described layered structure of the piezoelectric substrate 5 is able to maintain the Q factor of the resonator 100 at a high value. Thus, a SAW filter that implements low loss in the pass band is successfully fabricated.

Note that the high-acoustic-velocity supporting substrate 51 may include a structure in which a supporting substrate and a high-acoustic-velocity film through which a bulk wave propagates at an acoustic velocity higher than that of an elastic wave, for example, a surface acoustic wave or a boundary wave, that propagates through the piezoelectric film 53 are stacked. In this case, a substrate including a piezoelectric body, for example, sapphire, lithium tantalate, lithium niobate, or quartz; of ceramics, for example, alumina, magnesia, silicon nitride, aluminum nitride, silicon carbide, zirconia, cordierite, mullite, steatite, or forsterite; of a dielectric, for example, glass; of a semiconductor, for example, silicon or gallium nitride; or of a resin is able to be included as the supporting substrate. In addition, various high-acoustic-velocity materials, for example, aluminum nitride, aluminum oxide, silicon carbide, silicon nitride, silicon oxynitride, a DLC film, or diamond; a medium including one of the above materials as a primary component; or a medium including a mixture of some of the above materials is able to be included as the high-acoustic-velocity film.

In FIGS. 2A and 2B, "λ" denotes the pitch of each of the pluralities of electrode fingers 110a and 110b respectively defining the IDT electrodes 101a and 101b, "L" denotes an overlapping width of the IDT electrodes 101a and 101b, "W" denotes a width of each of the electrode fingers 110a and 110b, "S" denotes a width between each of the electrode fingers 110a and its adjacent electrode finger 110b, and "h" denotes a height of the IDT electrodes 101a and 101b.

Circuit configurations of the filters will be described below with reference to FIGS. 3A to 6D.

Figure 3A:
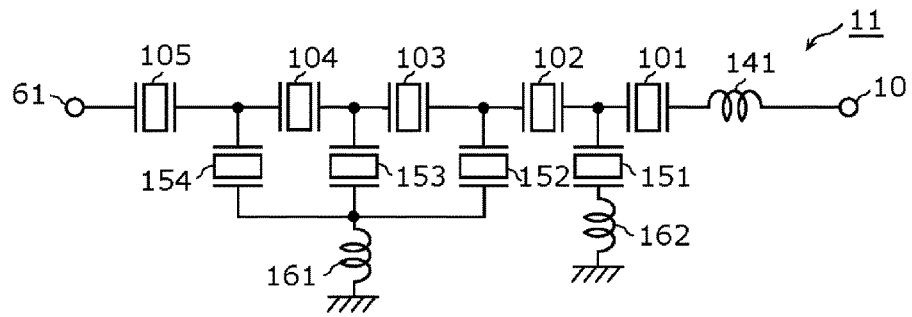
FIG. 3A is a diagram illustrating a circuit of a Band 25 transmission filter included in the multiplexer according to the first preferred embodiment of the present invention.

FIG. 3A is a diagram illustrating a circuit of the Band 25 transmission filter 11 included in the multiplexer 1 according to the first preferred embodiment. As illustrated in FIG. 3A, the transmission filter 11 includes series resonators 101 to 105, parallel resonators 151 to 154, and inductance elements 141, 161, and 162 for matching.

The series resonators 101 to 105 are connected in series to one another between the transmission input terminal 10 and a transmission output terminal 61. In addition, the parallel resonators 151 and 154 are connected between the reference terminal (ground) and respective nodes between the series resonators 101 to 105 to be in parallel to one another. With the above-described connections of the series resonators 101 to 105 and the parallel resonators 151 to 154, the transmission filter 11 is a ladder band pass filter.

The inductance element 141 is connected in series between the transmission input terminal 10 and the series resonator 101. The inductance element 141 defines and functions as a third inductance element. The transmission filter 11 that is preferably isolated from the reception filter 12 to which the inductance element 21 (described later) is connected includes the inductance element 141 that is connected in series to the transmission input terminal 10 located on the side opposite to the side where the common terminal 50 connected to the antenna element 2 is located. Note that the inductance element 141 may be connected in parallel to the transmission input terminal 10, that is, between the reference terminal and a connection path of the transmission input terminal 10 and the series resonator 101. With the inductance element 141, isolation of the transmission filter 11 is successfully increased by coupling between the inductance element 141 and the other inductance elements 161 and 162.

The inductance element 161 is connected between the reference terminal and a node among the parallel resonators 152, 153, and 154. The inductance element 162 is connected between the reference terminal and the parallel resonator 151.

The transmission output terminal 61 is connected to the common terminal 50 (see FIG. 1). In addition, the transmission output terminal 61 is connected to the series resonator 105 and is not directly connected to any of the parallel resonators 151 to 154.

Figure 3B:
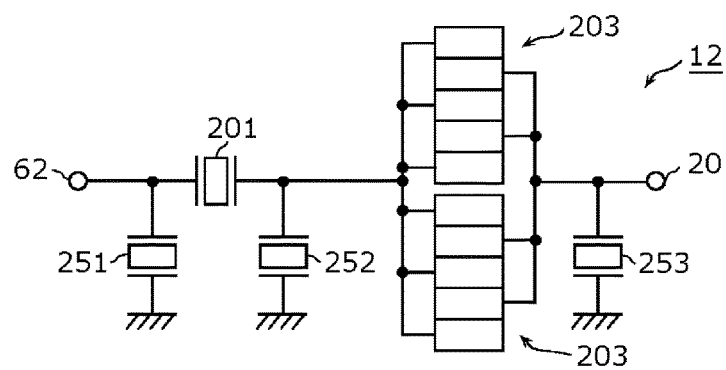
FIG. 3B is a diagram illustrating a circuit of a Band 25 reception filter included in the multiplexer according to the first preferred embodiment of the present invention.
Figure 3C:
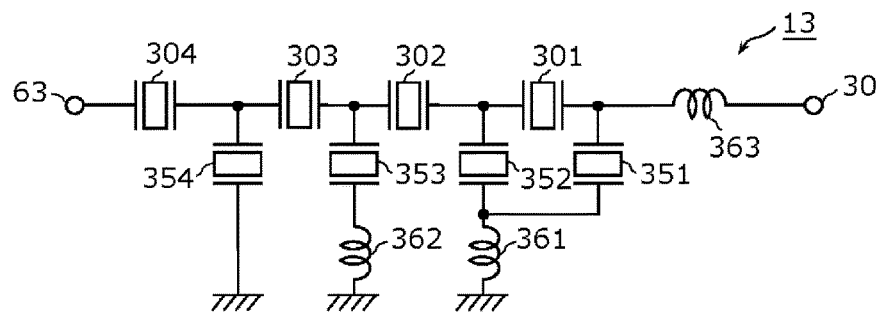
FIG. 3C is a diagram illustrating a circuit of a Band 66 transmission filter included in the multiplexer according to the first preferred embodiment of the present invention.

FIG. 3C is a diagram illustrating a circuit of the Band 66 transmission filter 13 included in the multiplexer 1 according to the first preferred embodiment. As illustrated in FIG. 3C, the transmission filter 13 includes series resonators 301 to 304, parallel resonators 351 to 354, and inductance elements 361 to 363 to perform matching.

The series resonators 301 to 304 are connected in series to one another between the transmission input terminal 30 and a transmission output terminal 63. The parallel resonators 351 to 354 are connected between the reference terminal (ground) and respective nodes between the transmission input terminal 30 and the series resonators 301 to 304. With the above-described connections of the series resonators 301 to 304 and the parallel resonators 351 to 354, the transmission filter 13 is a ladder band pass filter. In addition, the inductance element 361 is connected between the reference terminal and a node between the parallel resonators 351 and 352. The inductance element 362 is connected between the reference terminal and the parallel resonator 353. The inductance element 363 is connected between the transmission input terminal 10 and the series resonator 301. The inductance element 363 defines and functions as a third inductance just like the inductance element 141 of the transmission filter 11 described above. The inductance element 363 may be connected in parallel to the transmission input terminal 30, that is, between the reference terminal and a connection path of the transmission input terminal 30 and the series resonator 301.

The transmission output terminal 63 is connected to the common terminal 50 (see FIG. 1). In addition, the transmission output terminal 63 is connected to the series resonator 304 and is not connected directly to any of the parallel resonators 351 to 354.

FIG. 3B is a diagram illustrating a circuit configuration of the Band 25 reception filter 12 included in the multiplexer 1 according to the first preferred embodiment. As illustrated in FIG. 3B, the reception filter 12 includes a longitudinally-coupled SAW filter unit, for example. More specifically, the reception filter 12 includes a longitudinally-coupled filter unit 203, a series resonator 201, and parallel resonators 251 to 253.

Figure 4:
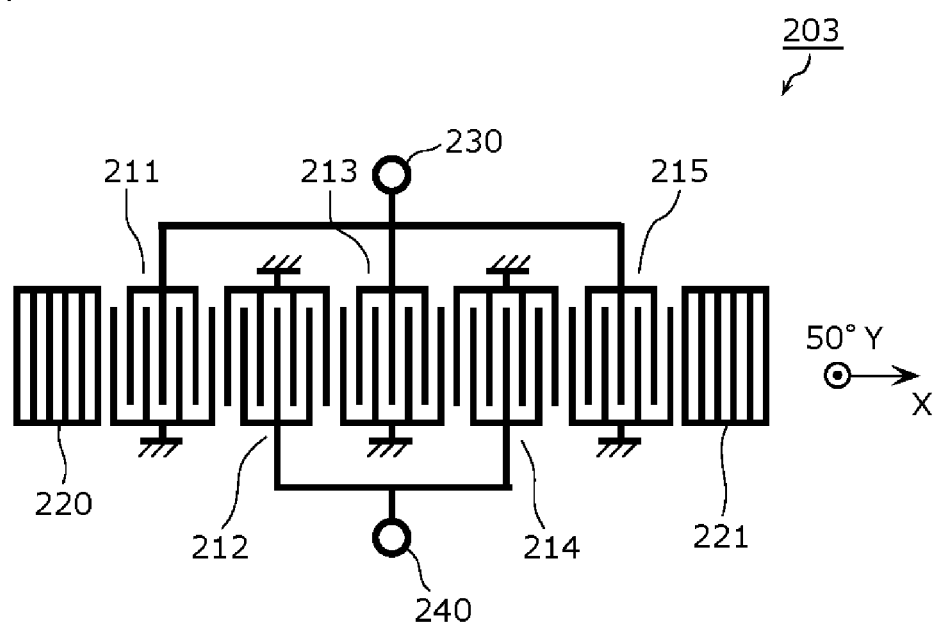
FIG. 4 is a schematic plan view illustrating electrodes of a longitudinally-coupled SAW filter according to the first preferred embodiment of the present invention.

FIG. 4 is a schematic plan view illustrating electrodes of the longitudinally-coupled filter unit 203 according to the first preferred embodiment. As illustrated in FIG. 4, the longitudinally-coupled filter unit 203 includes IDTs 211 to 215, reflectors 220 and 221, an input port 230, and an output port 240.

Each of the IDTs 211 to 215 is defined by a pair of IDT electrodes that oppose each other. The IDTs 212 and 214 sandwich the IDT 213 in the X-axis direction. The IDTs 211 and 215 sandwich the IDTs 212 to 214 in the X-axis direction. The reflectors 220 and 221 sandwich the IDTs 211 to 215 in the X-axis direction. The IDTs 211, 213, and 215 are connected between the input port 230 and the reference terminal (ground) to be in parallel to one another. The IDTs 212 and 214 are connected between the output port 240 and the reference terminal to be in parallel to each other.

In addition, as illustrated in FIG. 3B, the series resonator 201 and the parallel resonators 251 and 252 define a ladder filter.

A reception input terminal 62 is connected to the common terminal 50 (see FIG. 1) with the inductance element 21 (see FIG. 1) interposed therebetween. In addition, the reception input terminal 62 is connected to the parallel resonator 251 as illustrated in FIG. 3B.

Figure 3D:
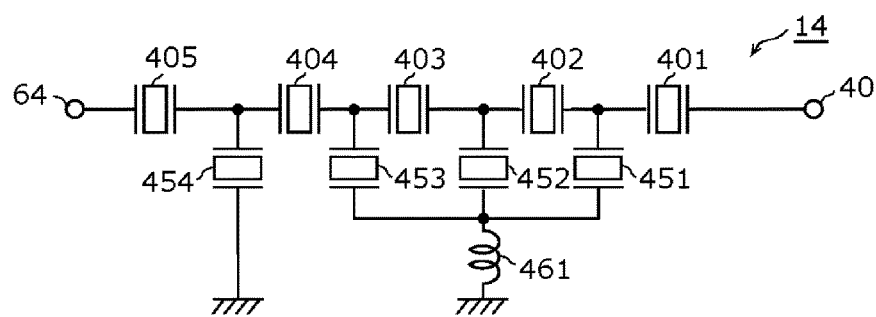
FIG. 3D is a diagram illustrating a circuit of a Band 66 reception filter included in the multiplexer according to the first preferred embodiment of the present invention.

FIG. 3D is a diagram illustrating a circuit of the Band 66 reception filter 14 included in the multiplexer 1 according to the first preferred embodiment. As illustrated in FIG. 3D, the reception filter 14 includes series resonators 401 to 405, parallel resonators 451 to 454, and an inductance element 461 to perform matching.

The series resonators 401 to 405 are connected in series to one another between the reception output terminal 40 and a reception input terminal 64. The parallel resonators 451 to 454 are connected between the reference terminal (ground) and respective nodes between the series resonators 401 to 405 to be in parallel to one another. With the above-described connections of the series resonators 401 to 405 and the parallel resonators 451 to 454, the reception filter 14 is a ladder band pass filter. In addition, the inductance element 461 is connected between the reference terminal and a node among the parallel resonators 451 to 453.

The reception input terminal 64 is connected to the common terminal 50 (see FIG. 1). In addition, the reception input terminal 64 is connected to the series resonator 405 and is not directly connected to the parallel resonator 454 as illustrated in FIG. 3D.

The arrangements of the resonators and the circuit elements of the SAW filters included in the multiplexer 1 according to the first preferred embodiment are not limited to the arrangements described for the transmission filters 11 and 13 and the reception filters 12 and 14 according to the first preferred embodiment. The arrangements of the resonators and the circuit elements of the SAW filters change depending on requirements regarding the band pass characteristics in respective frequency bands (Bands). The term "arrangements" recited herein refers to the numbers of series resonators and parallel resonators to be included and a filter to be selected, for example, a ladder structure or a longitudinally-coupled structure.

Among the arrangements of the resonators and the circuit elements of the SAW filters included in the multiplexer 1 according to the first preferred embodiment, major characteristics of preferred embodiments of the present invention are as follows: (1) Each of the transmission filters 11 and 13 and the reception filters 12 and 14 includes at least one of a series resonator and a parallel resonator; (2) The reception input terminal 62 of the reception filter 12, which defines and functions as one elastic wave filter, is connected to the common terminal 50 with the inductance element 21 interposed therebetween and is connected to the parallel resonator 251; and (3) The transmission output terminals 61 and 63 of the transmission filters 11 and 13 and the reception input terminal 64 of the reception filter 14, the transmission filters 11 and 13 and the reception filter 14 defining and functioning as other elastic wave filters other than the reception filter 12, are connected to the common terminal 50 and are respectively connected to the series resonators 105, 304, and 405 among the series resonators and the parallel resonators.

That is, the multiplexer 1 according to the first preferred embodiment include a plurality of SAW filters providing pass bands different from one another; the common terminal 50 connected to the antenna element 2 by a connection path, the inductance element 31 being connected between the reference terminal and the connection path; and the inductance element 21 connected in series between the common terminal 50 and the reception input terminal 62 of the reception filter 12 which defines and functions as one elastic wave filter.

Each of the plurality of SAW filters includes at least one of a series resonator that includes IDT electrodes disposed on the piezoelectric substrate 5 and is connected between the input terminal and the output terminal, and a parallel resonator that includes IDT electrodes disposed on the piezoelectric substrate 5 and is connected between the reference terminal and an electrical path that connects the input terminal and the output terminal to each other. In addition, the reception input terminal 62 of the reception filter 12 among the plurality of SAW filters is connected to the common terminal 50 with the inductance element 21 interposed therebetween and is connected to the parallel resonator 251. On the other hand, the transmission output terminals 61 and 63 of the transmission filters 11 and 13 and the reception input terminal 64 of the reception filter 14 are connected to the common terminal 50 and are respectively connected to the series resonators 105, 304, and 405 and are not connected to the parallel resonator.

In addition, the inductance element 31 is connected between the reference terminal and the connection path of the common terminal 50 and the antenna element 2 and is not connected in series between the common terminal 50 and the antenna element 2. Since there is no resistance component connected in series to each filter, the influence of the Q factor of the inductance element 31 on impedance matching is small. Thus, the multiplexer 1 with the above-described major characteristics significantly reduces insertion loss in the pass band of each filter included in the multiplexer 1 even when an inductance element with a low Q factor is included.

Figure 5A:
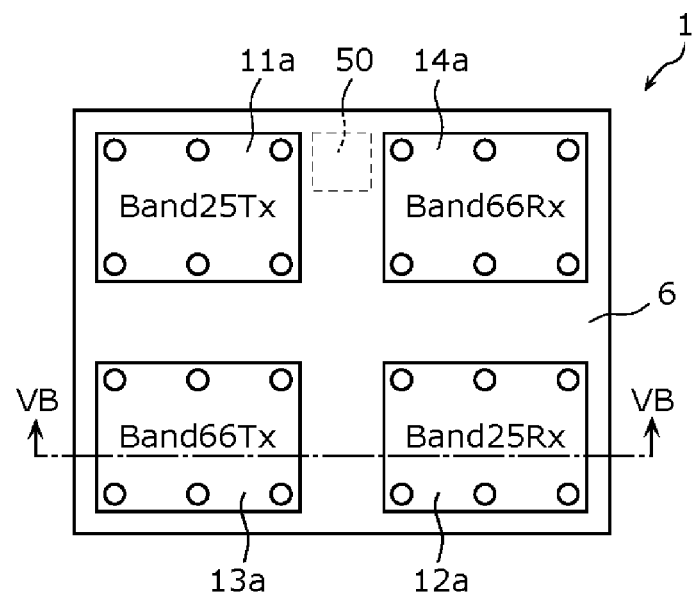
FIG. 5A is a plan view illustrating an example of an arrangement of piezoelectric substrates included in transmission filters and reception filters of the multiplexer according to the first preferred embodiment of the present invention.
Figure 5B:
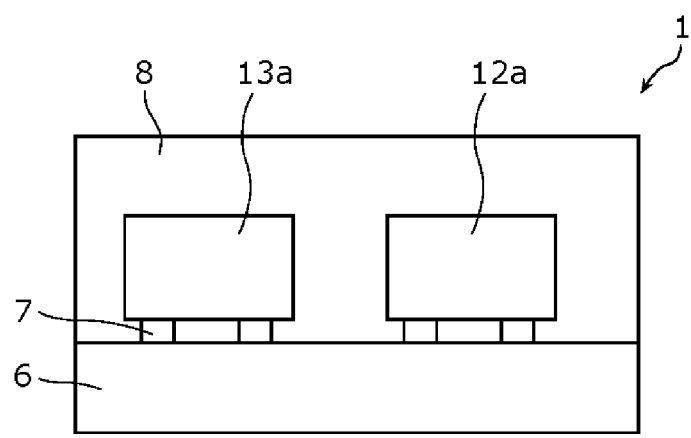
FIG. 5B is a cross-sectional view illustrating an example of the arrangement of the piezoelectric substrates included in the transmission filters and the reception filters of the multiplexer according to the first preferred embodiment of the present invention.

FIG. 5A is a plan view illustrating an example of an arrangement of the transmission filters 11 and 13 and the reception filters 12 and 14 of the multiplexer 1 according to the first preferred embodiment. FIG. 5B is a cross-sectional view illustrating an example of the arrangement of the transmission filters 11 and 13 and the reception filters 12 and 14 of the multiplexer 1 according to the first preferred embodiment. FIG. 5B is a cross-sectional view taken along line VB-VB illustrated in FIG. 5A.

As illustrated in FIGS. 5A and 5B, a piezoelectric substrates 11a and 13a respectively included in the transmission filters 11 and 13 and piezoelectric substrates 12a and 14a respectively included in the reception filters 12 and 14 are mounted on a mounting substrate 6 in the multiplexer 1.

More specifically, the piezoelectric substrates 11a, 12a, 13a, and 14a are mounted on the mounting substrate 6 by soldering 7 as illustrated in FIG. 5B.

In addition, the common terminal 50 is disposed on a surface of the mounting substrate 6 opposite to the surface on which the piezoelectric substrates 11a, 12a, 13a, and 14a are mounted, to be close to one end of the mounting substrate 6 as illustrated in FIG. 5A. The piezoelectric substrates 11a and 14a are located side by side with the common terminal 50 interposed therebetween to be close to the one end that is closest to the common terminal 50. In addition, the piezoelectric substrates 12a and 13a are located side by side to be close to another end opposing the one end that is closest to the common terminal 50. That is, the piezoelectric substrates 11a and 14a are located closer to the common terminal 50 than the piezoelectric substrates 12a and 13a. Note that the arrangement of the piezoelectric substrates 11a, 12a, 13a, and 14a is not limited to that illustrated in FIG. 5A, and the piezoelectric substrates 11a, 12a, 13a, and 14a may be provided in other arrangements or structural configurations.

In addition, a sealing resin 8 is disposed on the mounting substrate 6 to cover the piezoelectric substrates 11a, 12a, 13a, and 14a. The sealing resin 8 is a heat-curable or UV-curable resin.

FIGS. 6A to 6D are plan views illustrating an arrangement of the inductance elements 21 and 31 included in the multiplexer 1 according to the first preferred embodiment on one layer and other layers of the mounting substrate 6.

The mounting substrate 6 includes a multiplayer structure in which a plurality of printed circuit board layers are stacked. Wiring patterns and vias are provided on the plurality of printed circuit board layers. For example, the mounting substrate 6 includes a first layer 6a, a second layer 6b, a third layer 6c, and a fourth layer 6d as illustrated in FIGS. 6A to 6D. A wiring pattern 7a and a via 8a are disposed on the first layer 6a. A wiring pattern 7b and a via 8b are disposed on the second layer 6b. A wiring pattern 7c and a via 8c are disposed on the third layer 6c. A wiring pattern 7d and a via 8d are disposed on the fourth layer 6d.

Figure 6A:
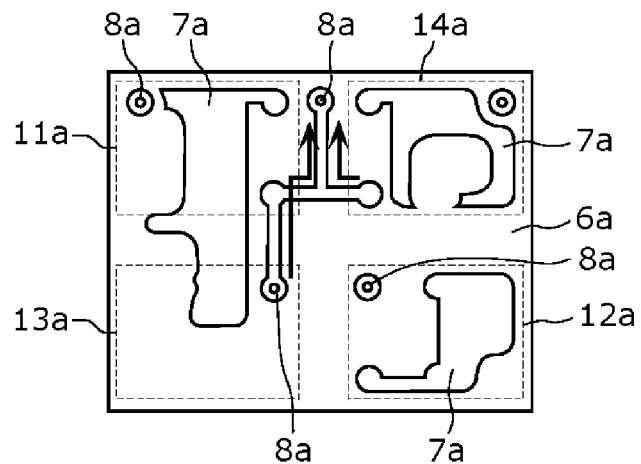
FIG. 6A is a plan view illustrating an arrangement of a first inductance element and a second inductance element included in the multiplexer according to the first preferred embodiment of the present invention on one of layers of a mounting substrate.
Figure 6B:
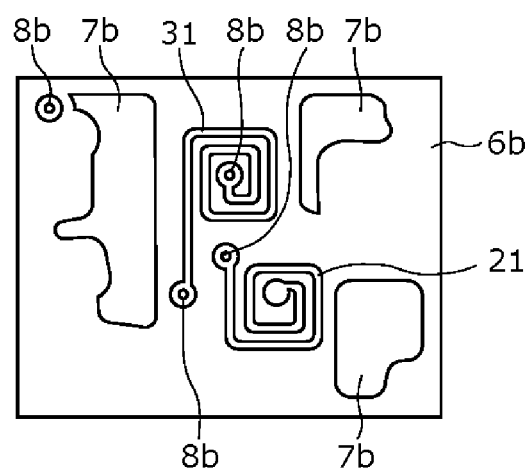
FIG. 6B is a plan view illustrating the arrangement of the first inductance element and the second inductance element included in the multiplexer according to the first preferred embodiment of the present invention on another layer of the mounting substrate.
Figure 6C:
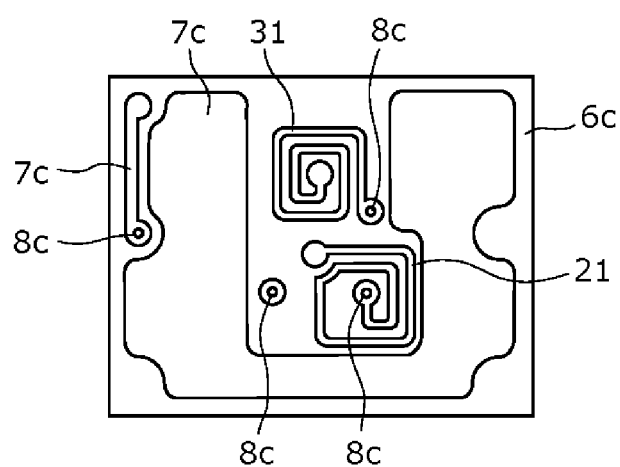
FIG. 6C is a plan view illustrating the arrangement of the first inductance element and the second inductance element included in the multiplexer according to the first preferred embodiment of the present invention on another layer of the mounting substrate.
Figure 6D:
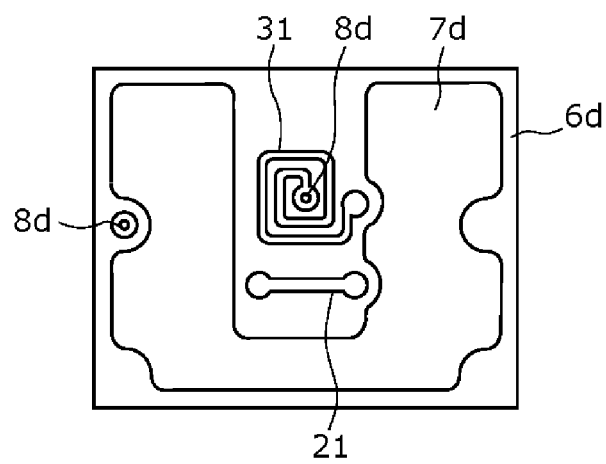
FIG. 6D is a plan view illustrating the arrangement of the first inductance element and the second inductance element included in the multiplexer according to the first preferred embodiment of the present invention on another layer of the mounting substrate.

In addition, the mounting substrate 6 includes therein the inductance elements 21 and 31. The mounting substrate 6 also includes therein the inductance elements included in the transmission filters 11 and 13 and the reception filter 14. Portions of the inductance elements 21 and 31 are disposed on the second layer 6b, the third layer 6c, and the fourth layer 6d as wiring patterns as illustrated in FIGS. 6B to 6D. The inductance elements 21 and 31 are formed by stacking the second layer 6b, the third layer 6c, and the fourth layer 6d and by connecting the wiring patterns of the inductance elements 21 and 31 on the second layer 6b and the third layer 6c and on the third layer 6c and the fourth layer 6d to each other.

Wirings of the inductance elements 21 and 31 are wound in a same or substantially a same direction as illustrated in FIGS. 6B to 6D. The winding directions of the wirings of the inductance elements 21 and 31 are (clockwise or counterclockwise) directions in which the wiring patterns of the inductance elements 21 and 31 are wound when the wiring patterns are traced from the first layer 6a to the fourth layer 6d in plan view of the mounting substrate 6 viewed from the first layer 6a. With the features described above, the inductance elements 21 and 31 provide mutual inductance. Thus, areas occupied by the inductance elements 21 and 31 in plan view are significantly reduced on the mounting substrate 6.

Now, an operation principle of a ladder SAW filter according to the first preferred embodiment will be described.

For example, each of the parallel resonators 151 to 154 illustrated in FIG. 3A provides a resonant frequency frp and an anti-resonant frequency fap (>frp) in resonance characteristics thereof. In addition, each of the series resonators 101 to 105 provides a resonant frequency frs and an anti-resonant frequency fas (>frs>frp) in resonance characteristics thereof. Although the resonant frequencies frs of the series resonators 101 to 105 are designed to be equal or substantially equal to one another, the resonant frequencies frs are not necessarily equal to one another. Similar features apply to the anti-resonant frequencies fas of the series resonators 101 to 105, the resonant frequencies frp of the parallel resonators 151 to 154, and the anti-resonant frequencies fap of the parallel resonators 151 to 154. That is, the resonant frequencies or the anti-resonant frequencies are not necessarily equal to one another.

To create a band pass filter by a ladder arrangement of resonators, the anti-resonant frequency fap of the parallel resonators 151 to 154 is set close to the resonant frequency frs of the series resonators 101 to 105. Consequently, a band around the resonant frequency frp at which impedance of the parallel resonators 151 to 154 approaches 0 becomes a lower-frequency-side stop band. If the frequency increases from the lower-frequency-side stop band, impedance of the parallel resonators 151 to 154 increases around the anti-resonant frequency fap and impedance of the series resonators 101 to 105 approaches 0 around the resonant frequency frs. Consequently, a band substantially between the anti-resonant frequency fap and the resonant frequency frs becomes a signal pass band in a signal path from the transmission input terminal 10 to the transmission output terminal 61. Further, if the frequency increases to approach the anti-resonant frequency fas, impedance of the series resonators 101 to 105 increases. Consequently, a band around the anti-resonant frequency fas becomes a higher-frequency-side stop band. That is, the sharpness of the attenuation characteristics in the high-frequency-side stop band is significantly affected depending on which point outside the signal pass band the anti-resonant frequency fas of the series resonators 101 to 105 is set to.

When a high-frequency signal is input to the transmission filter 11 from the transmission input terminal 10, a potential difference occurs between the transmission input terminal 10 and the reference terminal. This causes the piezoelectric substrate 5 to distort and generates a surface acoustic wave that propagates in the X-axis direction. Only a high-frequency signal including a desired frequency component passes through the transmission filter 11 if the pitch λ of the IDT electrodes 101a and 101b is set equal or substantially equal to the wavelength of the pass band.

High-frequency transmission characteristics and impedance characteristics of the multiplexer 1 according to the first preferred embodiment will be described below by comparing the multiplexer 1 according to the first preferred embodiment with a multiplexer according to a comparative example.

High-frequency transmission characteristics of the multiplexer 1 according to the first preferred embodiment will be described below in comparison with high-frequency transmission characteristics of a multiplexer according to a comparative example.

The multiplexer according to the comparative example includes the following features. In contrast to the multiplexer 1 according to the first preferred embodiment illustrated in FIG. 1, the inductance element 31 is not connected between ground defining and functioning as the reference terminal and the connection path of the common terminal 50 and the antenna element 2; instead, an inductance element is connected in series between the common terminal 50 and the antenna element 2.

Figure 7A:
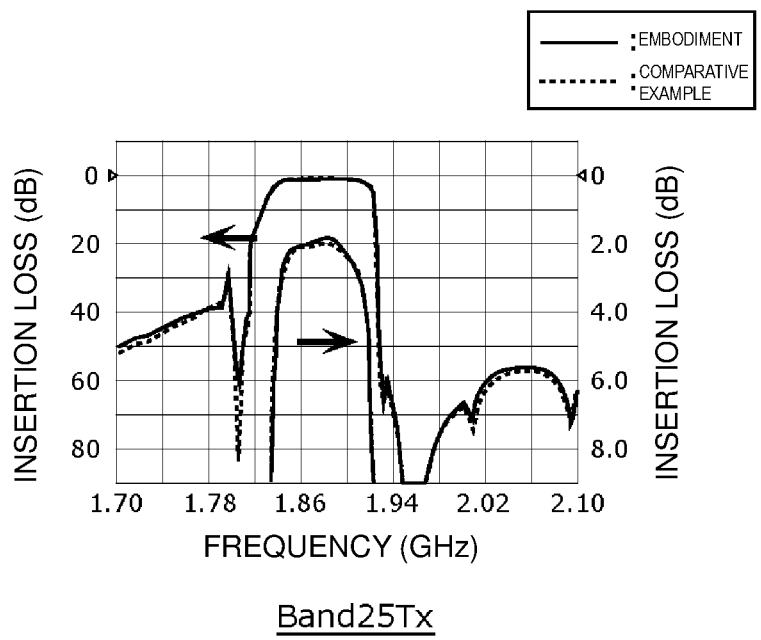
FIG. 7A is a graph in which band pass characteristics of the Band 25 transmission filter according to the first preferred embodiment of the present invention are compared with band pass characteristics of a Band 25 transmission filter according to a comparative example.
Figure 7B:
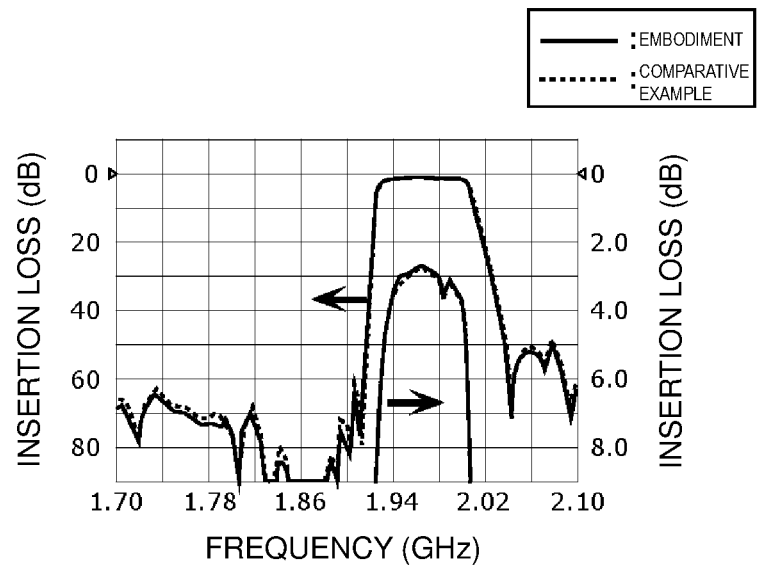
FIG. 7B is a graph in which band pass characteristics of the Band 25 reception filter according to the first preferred embodiment of the present invention are compared with band pass characteristics of a Band 25 reception filter according to the comparative example.
Figure 7C:
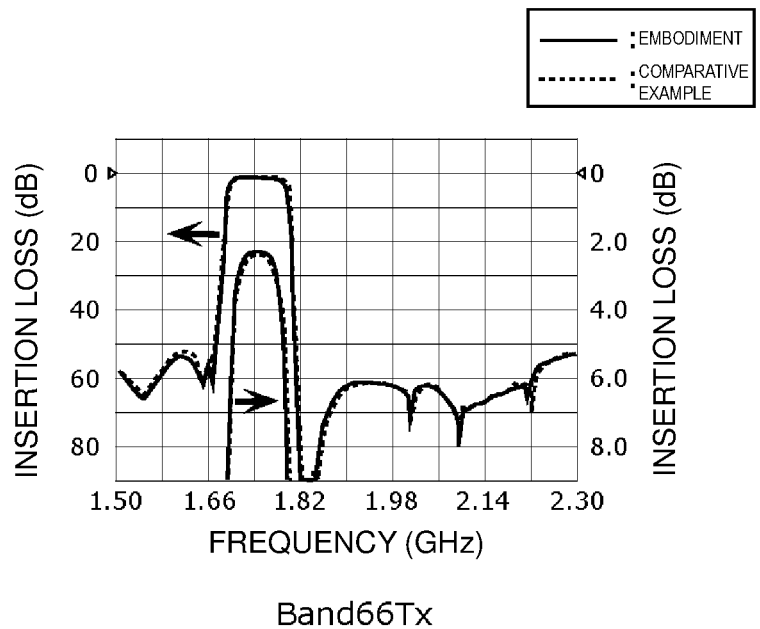
FIG. 7C is a graph in which band pass characteristics of the Band 66 transmission filter according to the first preferred embodiment of the present invention are compared with band pass characteristics of a Band 66 transmission filter according to the comparative example.
Figure 7D:
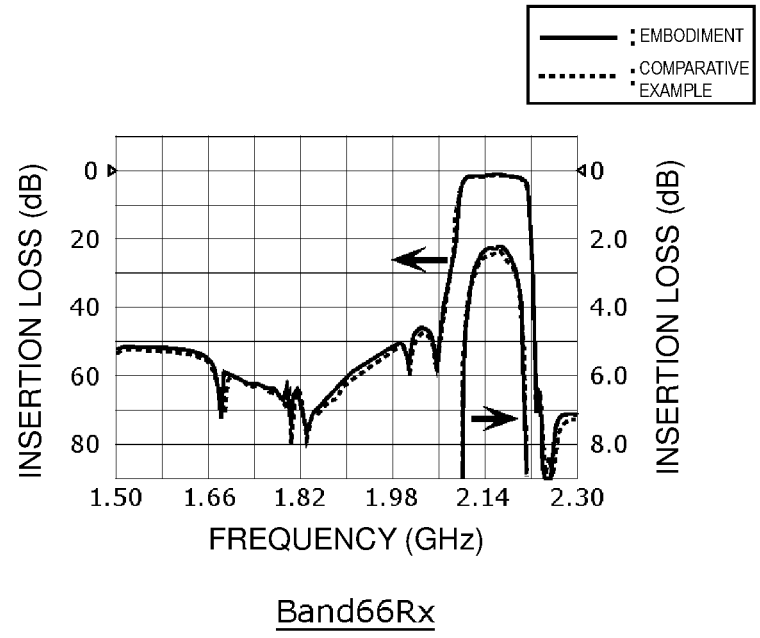
FIG. 7D is a graph in which band pass characteristics of the Band 66 reception filter according to the first preferred embodiment of the present invention are compared with band pass characteristics of a Band 66 reception filter according to the comparative example.

FIG. 7A is a graph in which band pass characteristics of the Band 25 transmission filter 11 according to the first preferred embodiment are compared with band pass characteristics of a Band 25 transmission filter according to the comparative example. FIG. 7B is a graph in which band pass characteristics of the Band 25 reception filter 12 according to the first preferred embodiment are compared with band pass characteristics of a Band 25 reception filter according to the comparative example. FIG. 7C is a graph in which band pass characteristics of the Band 66 transmission filter 13 according to the first preferred embodiment are compared with band pass characteristics of a Band 66 transmission filter according to the comparative example. FIG. 7D is a graph in which band pass characteristics of the Band 66 reception filter 14 according to the first preferred embodiment are compared with band pass characteristics of a Band 25 reception filter according to the comparative example.

FIGS. 7A to 7D indicate that insertion loss in the pass bands of the multiplexer 1 according to the first preferred embodiment is significantly improved compared to insertion loss in the pass bands of the multiplexer according to the comparative example for transmission and reception in Band 25 and transmission and reception in Band 66. Further, the figures indicate that the multiplexer 1 according to the first preferred embodiment meets the requirements in the pass bands (transmission insertion loss is less than or equal to about 2.0 dB and reception insertion loss is less than or equal to about 3.0 dB) in the transmission and reception frequency bands of Band 25 and the reception frequency band of Band 66.

On the other hand, the multiplexer according to the comparative example does not meet the requirements in the pass bands for transmission and reception in Band 25.

As described above, the multiplexer 1 according to the first preferred embodiment significantly reduces insertion loss in the pass band of each filter included in the multiplexer 1 even if the number of bands and the number of modes to be supported increase.

Impedance matching in the multiplexer 1 will be described below including reasons why the multiplexer 1 according to the first preferred embodiment is able to implement low insertion loss in the pass bands.

Figure 8A:
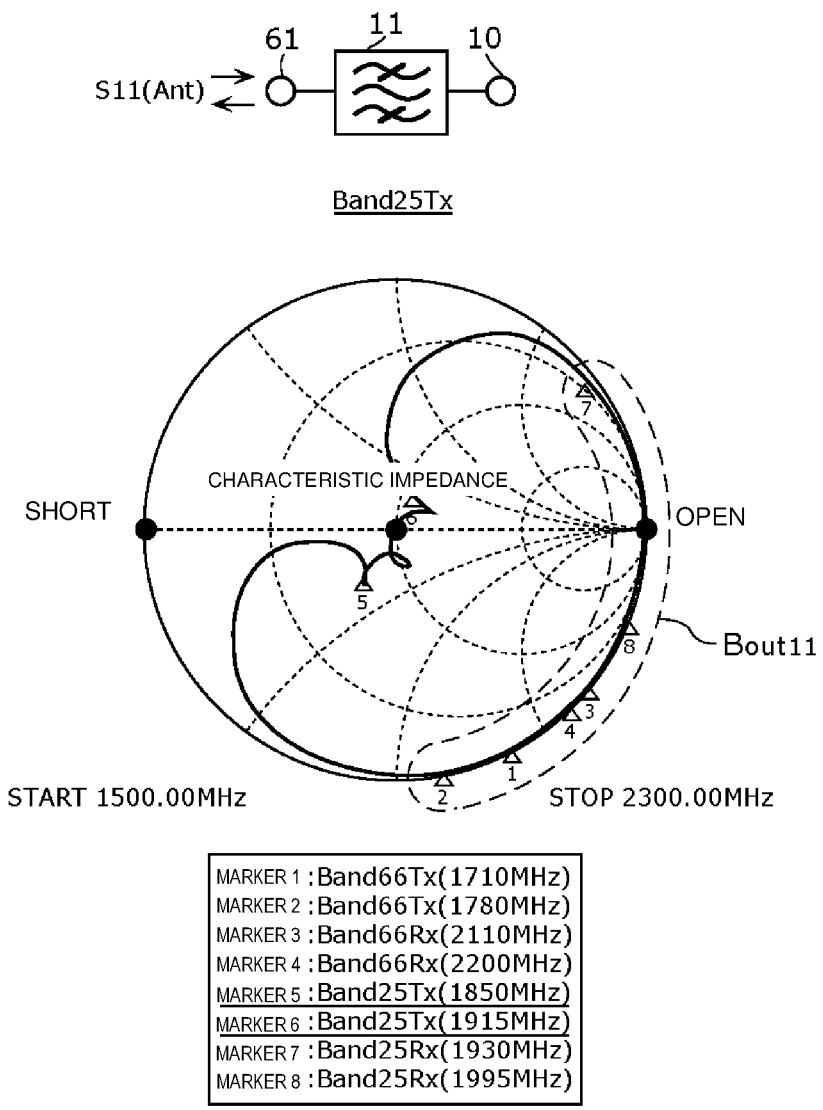
FIG. 8A is a Smith chart illustrating complex impedance viewed from a transmission output terminal of the Band 25 transmission filter according to the first preferred embodiment of the present invention alone.
Figure 8B:
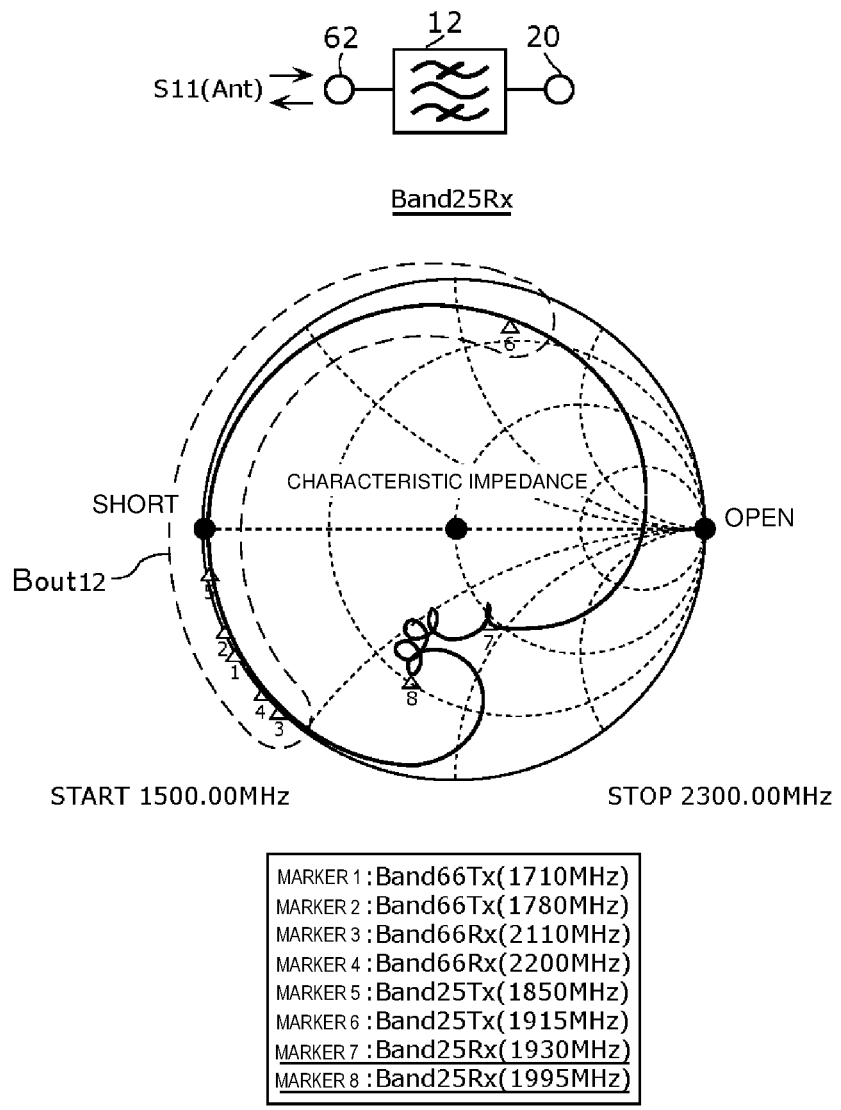
FIG. 8B is a Smith chart illustrating complex impedance viewed from a reception input terminal of the Band 25 reception filter according to the first preferred embodiment of the present invention alone.

FIGS. 8A and 8B are a Smith chart illustrating complex impedance viewed from the transmission output terminal 61 of the Band 25 transmission filter 11 according to the first preferred embodiment alone and a Smith chart illustrating complex impedance viewed from the reception input terminal 62 of the Band 25 reception filter 12 according to the first preferred embodiment alone, respectively. In addition, FIGS. 8C and 8D are a Smith chart illustrating complex impedance viewed from the transmission output terminal 63 of the Band 66 transmission filter 13 according to the first preferred embodiment alone and a Smith chart illustrating complex impedance viewed from the reception input terminal 64 of the Band 66 reception filter 14 according to the first preferred embodiment alone, respectively.

In the multiplexer 1 according to the first preferred embodiment, complex impedance in the frequency region outside the pass band is designed to be located on the open side in the impedance characteristics of the transmission filters 11 and 13 and the reception filter 14 alone. Specifically, complex impedance of an out-of-pass-band region $B_{out11}$ of the transmission filter 11 to which the inductance element 21 is not connected, complex impedance of an out-of-pass-band region $B_{out13}$ of the transmission filter 13 to which the inductance element 21 is not connected, and complex impedance of an out-of-pass-band region $B_{out14}$ of the reception filter 14 to which the inductance element 21 is not connected are located on substantially the open side in FIGS. 8A, 8C, and 8D, respectively. To implement these complex impedance arrangements, series resonators instead of parallel resonators are connected to the common terminal 50 in the three filters.

On the other hand, a parallel resonator is connected to the common terminal 50 in the reception filter 12 to which the inductance element 21 is connected. Therefore, complex impedance of an out-of-pass-band region $B_{out12}$ of the reception filter 12 is located on substantially the short side as illustrated in FIG. 8B. The purpose of arranging the complex impedance of the out-of-pass-band region $B_{out12}$ on the short side will be described later.

Figure 9:
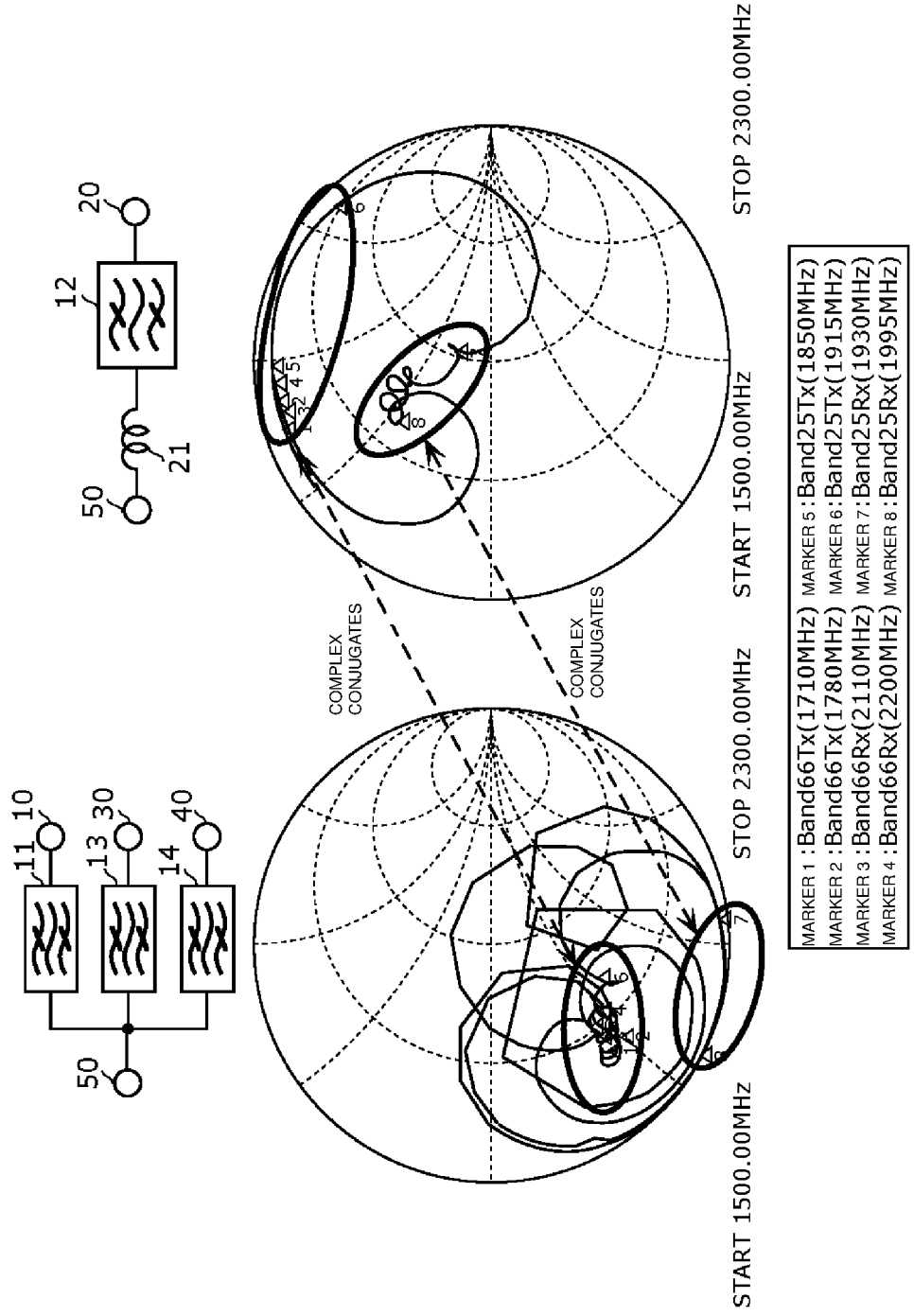
FIG. 9 illustrates a Smith chart of complex impedance viewed from a common terminal of a circuit alone in which all the filters other than the Band 25 reception filter according to the first preferred embodiment of the present invention are connected to the common terminal to be in parallel to one another and a Smith chart of complex impedance viewed from an inductance element of a circuit alone in which the Band 25 reception filter according to the first preferred embodiment of the present invention and the inductance element are connected in series to each other.

FIG. 9 illustrates a Smith chart (left) of complex impedance viewed from the common terminal 50 of a circuit alone in which all the filters other than the Band 25 reception filter 12 according to the first preferred embodiment are connected to the common terminal 50 to be in parallel to one another and a Smith chart (right) of complex impedance viewed from the common terminal 50 of a circuit alone in which the Band 25 reception filter according to the first preferred embodiment and the inductance element 21 are connected in series to each other.

As illustrated in FIG. 9, the complex impedance in a predetermined pass band provided by viewing the reception filter 12 alone through the inductance element 21 in a state where the inductance element 21 and the reception input terminal of the reception filter 12 are connected in series to each other and the complex impedance in the predetermined pass band provided by viewing the transmission filters 11 and 13 and the reception filter 14 from terminals that are closer to the antenna element 2 among the input terminals and the output terminals of the transmission filters 11 and 13 and the reception filter 14 and that are connected to the common terminal 50 in a state where the terminals are connected to the common terminal 50 generally provide a relationship close to complex conjugates. That is, impedance matching is provided if the two complex impedances are combined, and consequently complex impedance of the combined circuit is located close to the characteristic impedance.

Note that complex impedances of two circuits with a relationship of complex conjugates also includes a relationship in which the signs of complex components of the complex impedances are opposite and is not limited to the case where absolute values of the complex components are equal or substantially equal to each other. That is, in the first preferred embodiment, the relationship of complex conjugates includes a relationship in which the complex impedance of one of the circuits is located on a capacitive side (in a lower half of the Smith chart) and the complex impedance of the other circuit is located on an inductive side (in an upper half of the Smith chart).

The purpose of arranging the complex impedance of the out-of-pass-band region $B_{out12}$ of the reception filter 12 on the short side as illustrated in FIG. 8B is to shift the complex impedance of the out-of-pass-band region $B_{out12}$ (the pass bands of the transmission filters 11 and 13 and the reception filter 14) to a position that implements the relationship of complex conjugates by including the inductance element 21. In this case, the inductance element 21 includes an inductance value of about 5.9 nH, for example.

If the complex impedance of the out-of-pass-band region $B_{out12}$ of the reception filter 12 is located on the open side, the complex impedance of the out-of-pass-band region $B_{out12}$ is preferably shifted to the position that implements the relationship of complex conjugates by including the inductance element 21 with a higher inductance value. Since the inductance element 21 is connected in series to the reception filter 12, insertion loss in the pass band of the reception filter 12 increases as the inductance value increases. However, the inductance value of the inductance element 21 is able to be significantly reduced by arranging the complex impedance of the out-of-pass-band region $B_{out12}$ on the short side by including the parallel resonator 251 as in the reception filter 12 according to the first preferred embodiment. Thus, insertion loss in the pass band is significantly reduced.

FIG. 10A is a Smith chart illustrating complex impedance provided by viewing the multiplexer 1 according to the first preferred embodiment from the common terminal 50. That is, the complex impedance illustrated in FIG. 10A is complex impedance viewed from the common terminal 50 of the multiplexer 1 that is provided by combining the two circuits illustrated in FIG. 9 together. As a result of arranging the complex impedances of the two circuits illustrated in FIG. 9 to provide the relationship of complex conjugates, the complex impedance of the combined circuit approaches the characteristic impedance in the four pass bands and impedance matching is implemented.

FIG. 10B is a Smith chart illustrating complex impedance viewed from the antenna element 2 in the case where the inductance element 31 is connected between the reference terminal and the connection path of the antenna element 2 and the common terminal 50 of the multiplexer 1 according to the first preferred embodiment. As illustrated in FIG. 10A, the complex impedance is shifted toward the capacitive side and toward the short side from the characteristic impedance in the circuit provided by combining together the two circuits whose complex impedances are included in the relationship of complex conjugates.

In contrast, the complex impedance of the multiplexer 1 viewed from the common terminal 50 is adjusted by connecting the inductance element 31 between the reference terminal and the connection path of the common terminal 50 and the antenna element 2. In this case, the inductance element 31 includes an inductance value of about 5.6 nH, for example.

Figure 11:
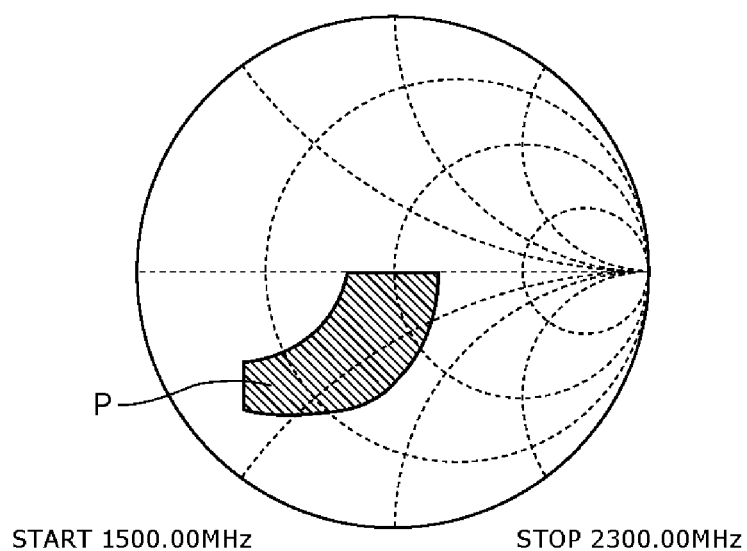
FIG. 11 is a Smith chart illustrating a range of complex impedance viewed from the antenna element in the case where the inductance element is connected between the reference terminal and a connection path of the antenna element and the common terminal of the multiplexer according to the first preferred embodiment of the present invention.

Now, a range in which impedance matching is successfully provided by connecting the inductance element 31 between the reference terminal and the connection path of the common terminal 50 and the antenna element 2 will be described. FIG. 11 is a Smith chart illustrating a range of complex impedance viewed from the antenna element 2 in the case where the inductance element 31 is connected between the reference terminal and the connection path of the antenna element 2 and the common terminal 50 of the multiplexer 1 according to the first preferred embodiment.

The range in which impedance matching is successfully provided by connecting the inductance element 31 between the reference terminal and the connection path of the common terminal 50 and the antenna element 2 is limited to the range of a region P illustrated in FIG. 11. Specifically, the range in which impedance matching is successfully provided is the region P that is shifted toward the capacitive side and toward the short side from the characteristic impedance. As described below, complex impedances in this region P approach the characteristic impedance counterclockwise in the Smith chart as a result of connecting the inductance element 31. Thus, the complex impedance in the pass band of each filter included in the multiplexer 1 is successfully adjusted to match the characteristic impedance easily without degrading the insertion loss of the filter.

In FIG. 11, a portion near the upper left boundary of the region P indicates the case where the real part R of the characteristic impedance R+jX [Ω] (described later) is equal or substantially equal to about 40Ω, and a portion near the lower right boundary of the region P indicates the case where the real part R of the characteristic impedance R+jX [Ω] is equal or substantially equal to about 60Ω.

Values of the complex impedance included in the region P will be described specifically below.

Figure 12:
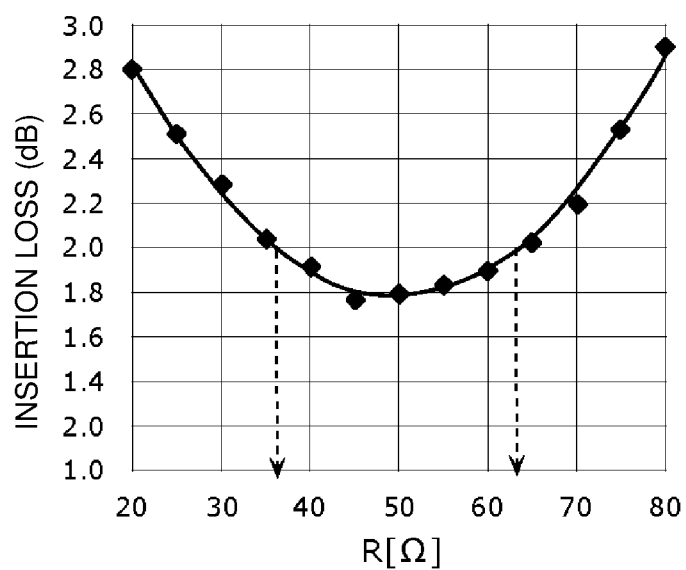
FIG. 12 is a diagram illustrating insertion loss of the multiplexer according to the first preferred embodiment of the present invention when the real part of the characteristic impedance is changed.

FIG. 12 is a graph illustrating insertion loss of the transmission filter 11 when the real part R of the characteristic impedance R+jX [Ω] is changed in the multiplexer 1 according to the first preferred embodiment. The insertion loss of the transmission filter 11 is preferably less than or equal to, for example, about 2 dB in view of a reduction in power consumption of a power amplifier (not illustrated) and significant improvement in the electric power handling capacity of the filter of the multiplexer 1. According to FIG. 12, the value of the real part R of the characteristic impedance R+jX [Ω] that provides an insertion loss of about 2 dB or less is about 38Ω to about 62Ω. Accordingly, the insertion loss is less than or equal to about 2 dB if the real part R of the characteristic impedance R+jX [Ω] is at least greater than or equal to about 40Ω and is less than or equal to about 60Ω (about 40≤R≤about 60).

Figure 13A:
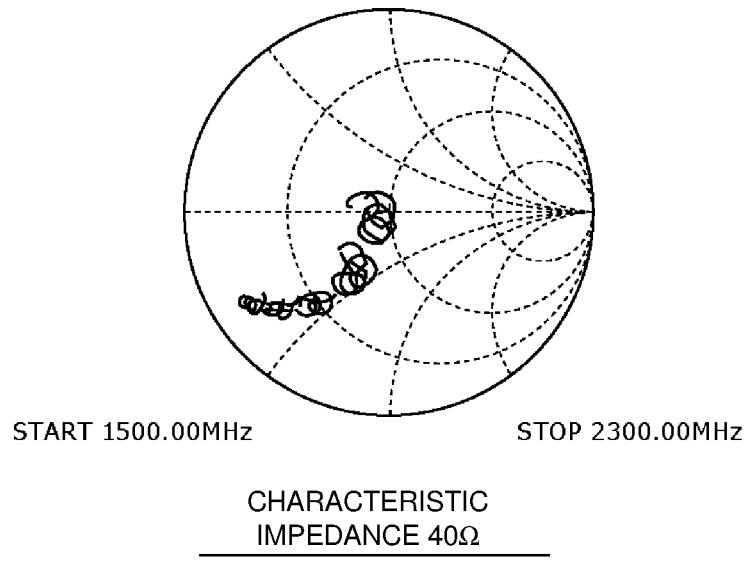
FIG. 13A is a Smith chart illustrating a change in complex impedance viewed from the common terminal of the multiplexer when the real part of the characteristic impedance is set to about 40Ω and the capacitance value of the filter is changed in the multiplexer according to the first preferred embodiment of the present invention.
Figure 13B:
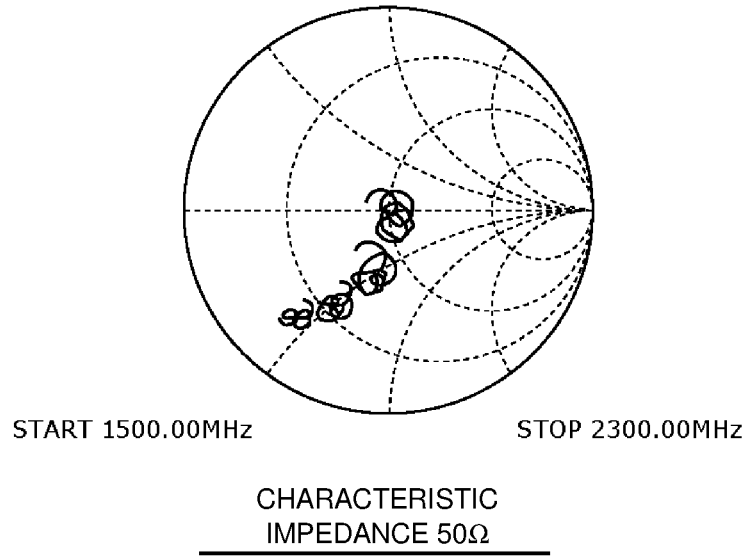
FIG. 13B is a Smith chart illustrating a change in complex impedance viewed from the common terminal of the multiplexer when the real part of the characteristic impedance is set to about 50Ω and the capacitance value of the filter is changed in the multiplexer according to the first preferred embodiment of the present invention.
Figure 13C:
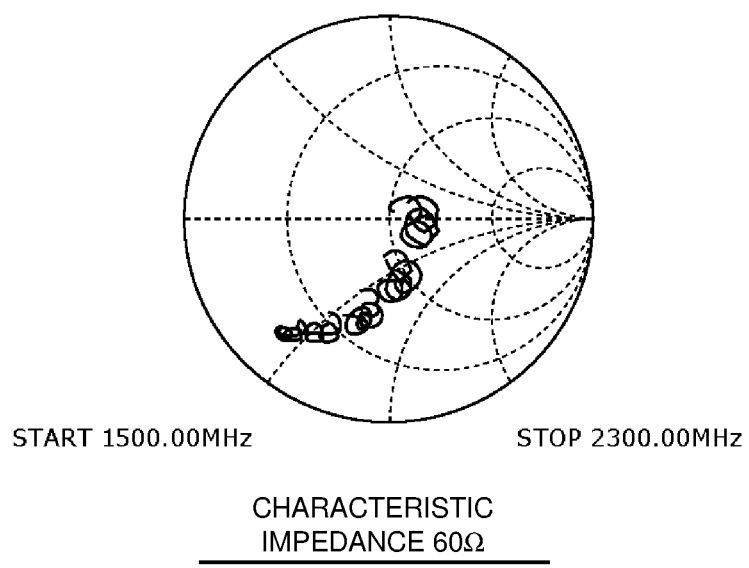
FIG. 13C is a Smith chart illustrating a change in complex impedance viewed from the common terminal of the multiplexer when the real part of the characteristic impedance is set to about 60Ω and the capacitance value of the filter is changed in the multiplexer according to the first preferred embodiment of the present invention.

A range of the value of the imaginary part X of the characteristic impedance R+jX [Ω] when the real part R of the characteristic impedance R+jX [Ω] is set in a range from about 40Ω to about 60Ω will be described next. FIGS. 13A to 13C are Smith charts illustrating complex impedance viewed from the common terminal 50 of the multiplexer 1 according to the first preferred embodiment when the real part R of the characteristic impedance R+jX [Ω] is set to about 40Ω, about 50Ω, and about 60Ω, respectively, and the capacitance value of the filter is changed.

A change in the characteristic impedance provided by changing the capacitance value of the filter to five values is checked in each of the cases where the real part R of the characteristic impedance R+jX [Ω] is set to about 40Ω, about 50Ω, and about 60Ω. Consequently, trajectories illustrated in FIGS. 13A and 13C are provided. In each of FIGS. 13A to 13C, the trajectory closest to the short side indicates the case where the inductance value is the smallest, and the trajectories closer to the open side indicates the cases where the inductance value is increased more. The value of the imaginary part X of the characteristic impedance R+jX [Ω] in the range of the trajectories is checked. The smallest value of the imaginary part X is about −40Ω. The value of the imaginary part X of the characteristic impedance R+jX [Ω] is less than about 0Ω since impedance matching is provided by connecting the inductance element 31 between the reference terminal and the connection path of the common terminal 50 and the antenna element 2. That is, the value of the imaginary part X of the characteristic impedance R+jX [Ω] is greater than or equal to about −40Ω and is less than about 0Ω (about −40≤X<about 0).

The characteristic impedance R+jX [Ω] viewed from the common terminal 50 of all the filters that are connected together via the common terminal 50 is preferably set in a range of, for example, about 40≤R≤about 60 and about −40≤X<about 0 in order to provide a preferred insertion loss on the assumption that impedance matching is provided by connecting the inductance element 31 between the reference terminal and the connection path of the common terminal 50 and the antenna element 2. In this way, impedance matching is successfully provided without degrading insertion losses of the transmission filters 11 and 13 and the reception filters 12 and 14.

As described above, in the multiplexer 1 according to the first preferred embodiment, (1) the inductance element 21 is connected in series between the reception filter 12 and the common terminal 50, (2) the inductance element 31 is connected between the reference terminal and the connection path of the common terminal 50 and the antenna element 2, (3) the parallel resonator 251 is connected to the reception input terminal 62 of the reception filter 12, and (4) the series resonators 105, 304, and 405 are connected to the transmission output terminal 61 of the transmission filter 11, the transmission output terminal 63 of the transmission filter 13, and the reception input terminal 64 of the reception filter 14, respectively.

With the features described above, complex impedance viewed from the common terminal 50 of the circuit alone in which the inductance element 21 and the reception filter 12 are connected in series and complex impedance viewed from the common terminal 50 of the circuit alone in which all the filters other than the reception filter 12 are connected to the common terminal 50 to be in parallel to one another provide the relationship of complex conjugates. As a result, the complex impedance viewed from the common terminal 50 of the multiplexer 1 including a combined circuit of the two circuits described above is successfully adjusted to match the characteristic impedance easily while implementing low insertion loss in the pass bands. In addition, the complex impedance viewed from the common terminal 50 of the multiplexer 1 is successfully adjusted toward the inductive side by connecting the inductance element 31 between the reference terminal and the connection path of the common terminal 50 and the antenna element 2.

Since the inductance element 31 is not connected in series between the common terminal 50 and the antenna element 2 but is connected between the reference terminal and the connection path of the common terminal 50 and the antenna element 2, no resistance component is connected in series to each of the filters. Thus, the influence of the Q factor of the inductance element 31 on impedance matching is small. Consequently, insertion losses in pass bands of elastic wave filters included in a multiplexer are significantly reduced even when an inductance element with a low Q factor is included.

Second Preferred Embodiment

In the multiplexer 1 described above, the reception filter 14 with the highest center frequency among the transmission filters 11 and 13 and the reception filter 14 other than the reception filter 12 to which the inductance element 21 is connected among the plurality of SAW filters 11 to 14 may include the shortest wiring in the mounting substrate 6, and the transmission filter 13 with the lowest center frequency among the transmission filters 11 and 13 and the reception filter 14 other than the reception filter 12 to which the inductance element 21 is connected may include the longest wiring in the mounting substrate 6. The reception filter 14 with the highest center frequency defines and functions as a first filter, and the transmission filter 13 with the lowest center frequency defines and functions as a second filter.

In the multiplexer 1 described above, the piezoelectric substrates 11a, 12a, 13a, and 14a are mounted on the mounting substrate 6 as illustrated in FIG. 5A. More specifically, the piezoelectric substrates 11a and 14a are located side by side with the common terminal 50 interposed therebetween to be close to one end of the mounting substrate 6 that is closest to the common terminal 50. In addition, the piezoelectric substrates 12a and 13a are located side by side to be close to another end opposing the one end that is closest to the common terminal 50. That is, the piezoelectric substrates 11a and 14a are located closer to the common terminal 50 than the piezoelectric substrates 12a and 13a.

With this arrangement, a wiring extending from the piezoelectric substrate 14a disposed to be close to the one end where the common terminal 50 is located to the via 8a connected to the common terminal 50 is shorter than a wiring extending from the piezoelectric substrate 13a to the via 8a connected to the common terminal 50 in the mounting substrate 6. That is, the wiring disposed between the reception filter 14 with the highest center frequency and the common terminal 50 is shorter than the wiring disposed between the transmission filter 13 with the lowest center frequency and the common terminal 50.

As a result, the multiplexer 1 is able to implement good impedance matching at the common terminal 50 connected to the antenna element 2 and good insertion loss of the reception filter 14 with the highest center frequency as described below.

Advantageous effects provided when the wiring disposed between the reception filter 14 and the common terminal 50 is shorter than the wiring disposed between the transmission filter 13 and the common terminal 50 will be described. A multiplexer 1a is provided as a comparative example below, and a description will be provided by comparing the multiplexer 1 with the multiplexer 1a.

Figure 14:
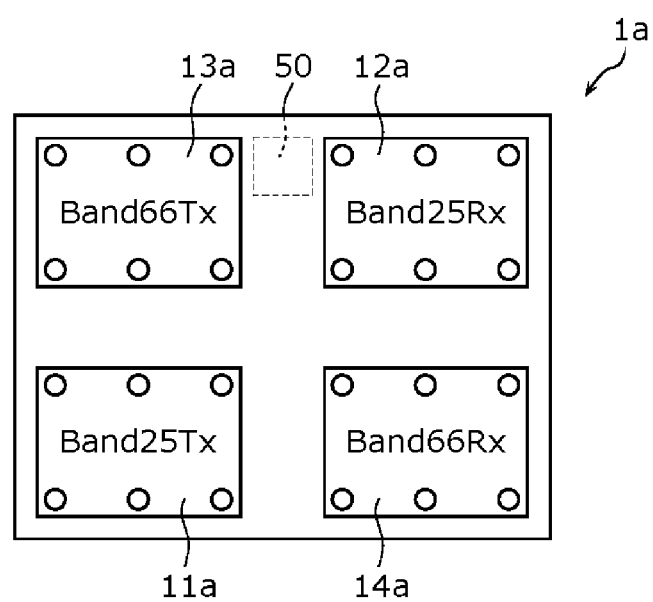
FIG. 14 is a plan view illustrating an example of an arrangement of piezoelectric substrates included in transmission filters and reception filters of a multiplexer according to a comparative example of a second preferred embodiment of the present invention.

First, features of the multiplexer 1a according to the comparative example will be described in terms of differences from the features of the multiplexer 1. FIG. 14 is a plan view illustrating an example of an arrangement of the piezoelectric substrates 11a, 13a, 12a, and 14a respectively included in the transmission filters 11 and 13 and the reception filters 12 and 14 of the multiplexer 1a according to the comparative example. FIGS. 15A to 15D are plan views illustrating wiring patterns of the multiplexer 1a according to the comparative example on one layer and other layers of a mounting substrate.

A difference of the multiplexer 1a from the multiplexer 1 is that a wiring disposed between the reception filter 14 with the highest center frequency and the common terminal 50 is longer than a wiring disposed between the transmission filter 13 with the lowest center frequency and the common terminal 50.

Specifically, the piezoelectric substrates 11a and 13a respectively included in the transmission filters 11 and 13 and the piezoelectric substrates 12a and 14a respectively included in the reception filters 12 and 14 are mounted on the mounting substrate 6 in the multiplexer 1a. The mounting substrate 6 includes the first layer 6a, the second layer 6b, the third layer 6c, and the fourth layer 6d as illustrated in FIGS. 15A to 15D. The wiring pattern 7a and the via 8a are disposed on the first layer 6a. The wiring pattern 7b and the via 8b are disposed on the second layer 6b. The wiring pattern 7c and the via 8c are disposed on the third layer 6c. The wiring pattern 7d and the via 8d are disposed on the fourth layer 6d.

In the multiplexer 1a, the piezoelectric substrates 12a and 13a are located side by side with the common terminal 50 interposed therebetween to be close to one end of the mounting substrate 6 that is closest to the common terminal 50 as illustrated in FIG. 14. In addition, the piezoelectric substrates 11a and 14a are located side by side to be close to another end of the mounting substrate 6 opposing the one end that is closest to the common terminal 50. That is, the piezoelectric substrates 12a and 13a are located closer to the common terminal 50 than the piezoelectric substrates 11a and 14a.

Figure 15A:
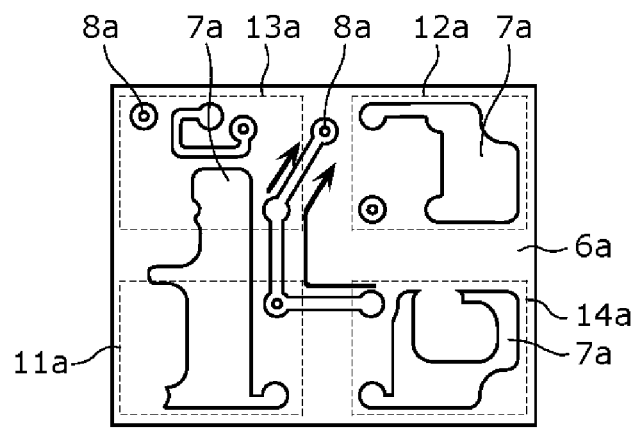
FIG. 15A is a plan view illustrating wiring patterns of the multiplexer according to the comparative example of the second preferred embodiment of the present invention on one of layers of a mounting substrate.
Figure 15B:
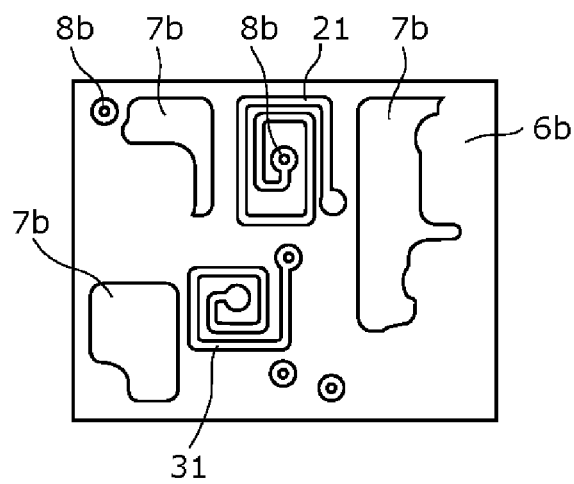
FIG. 15B is a plan view illustrating wiring patterns of the multiplexer according to the comparative example of the second preferred embodiment of the present invention on another layer of the mounting substrate.
Figure 15C:
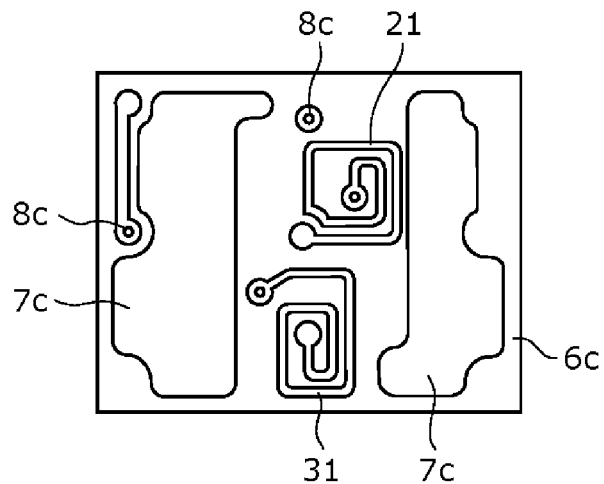
FIG. 15C is a plan view illustrating wiring patterns of the multiplexer according to the comparative example of the second preferred embodiment of the present invention on another layer of the mounting substrate.
Figure 15D:
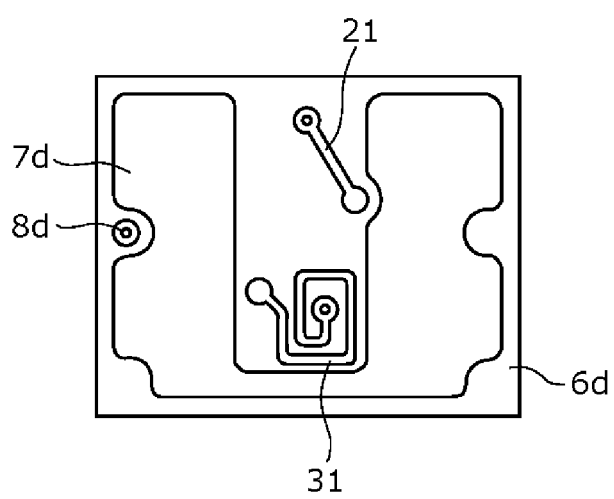
FIG. 15D is a plan view illustrating wiring patterns of the multiplexer according to the comparative example of the second preferred embodiment of the present invention on another layer of the mounting substrate.

With the arrangement described above, the wiring that extends from the piezoelectric substrate 13a located close to the one end of the mounting substrate 6 at which the common terminal 50 is disposed to the via 8a connected to the common terminal 50 is shorter than the wiring that extends from the piezoelectric substrate 14a to the via 8a connected to the common terminal 50 on the first layer 6a illustrated in FIG. 15A. That is, the wiring disposed between the reception filter 14 with the highest center frequency and the common terminal 50 is longer than the wiring disposed between the transmission filter 13 with the lowest center frequency and the common terminal 50.

Figure 16A:
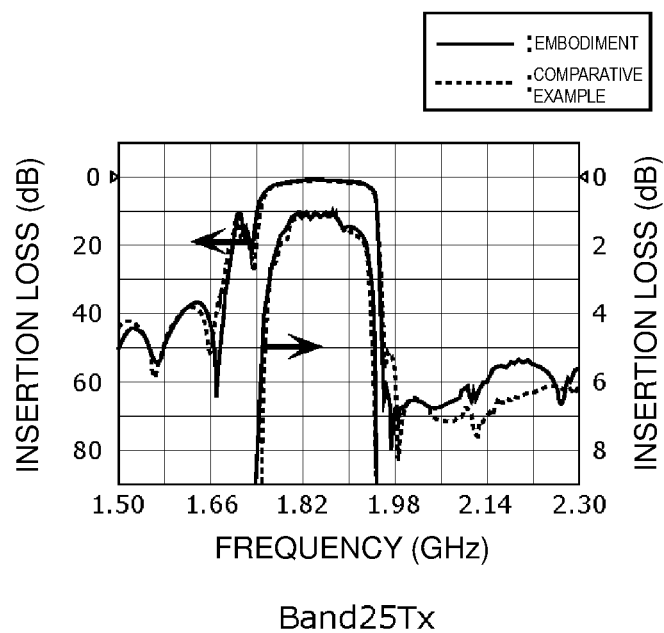
FIG. 16A is a graph in which band pass characteristics of a Band 25 transmission filter according to the second preferred embodiment of the present invention are compared with band pass characteristics of a Band 25 transmission filter according to the comparative example.
Figure 16B:
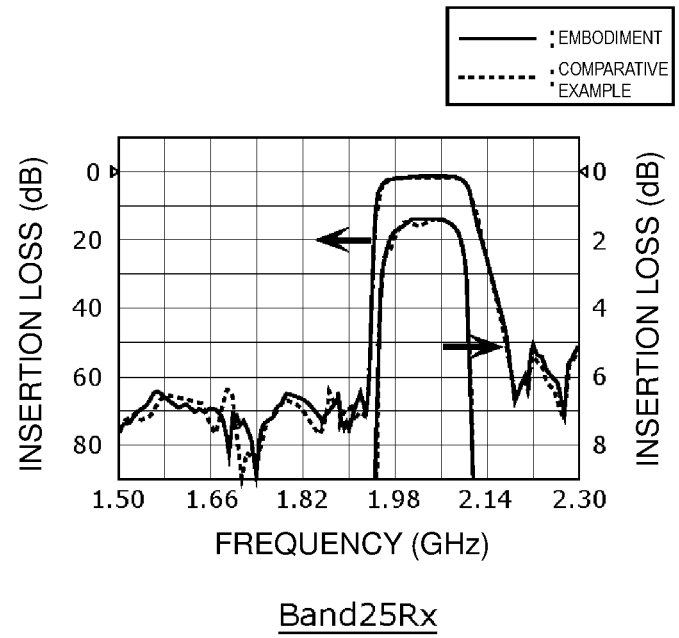
FIG. 16B is a graph in which band pass characteristics of a Band 25 reception filter according to the second preferred embodiment of the present invention are compared with band pass characteristics of a Band 25 reception filter according to the comparative example.
Figure 16C:
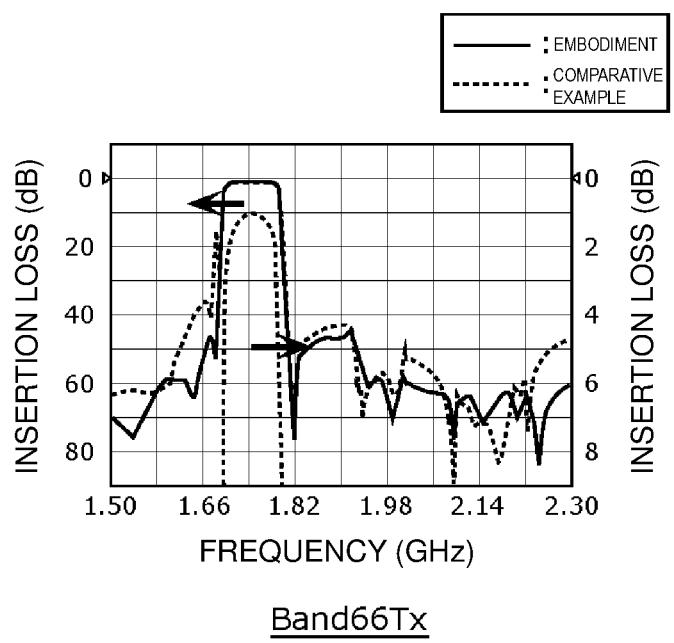
FIG. 16C is a graph in which band pass characteristics of a Band 66 transmission filter according to the second preferred embodiment of the present invention are compared with band pass characteristics of a Band 66 transmission filter according to the comparative example.
Figure 16D:
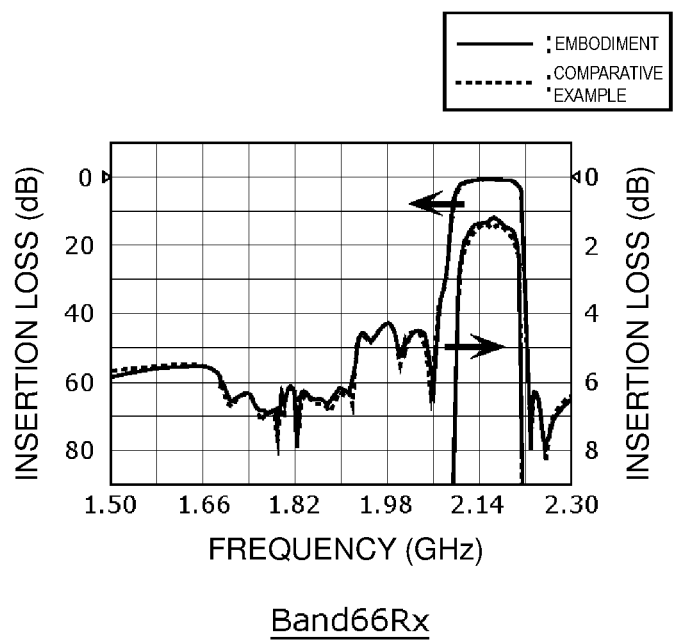
FIG. 16D is a graph in which band pass characteristics of a Band 66 reception filter according to the second preferred embodiment of the present invention are compared with band pass characteristics of a Band 66 reception filter according to the comparative example.

FIG. 16A is a graph in which band pass characteristics of the Band 25 transmission filter 11 according to the second preferred embodiment are compared with band pass characteristics of the Band 25 transmission filter according to the comparative example. FIG. 16B is a graph in which band pass characteristics of the Band 25 reception filter 12 according to the second preferred embodiment are compared with band pass characteristics of the Band 25 reception filter according to the comparative example. FIG. 16C is a graph in which band pass characteristics of the Band 66 transmission filter 13 according to the second preferred embodiment are compared with band pass characteristics of the Band 66 transmission filter according to the comparative example. FIG. 16D is a graph in which band pass characteristics of the Band 66 reception filter 14 according to the second preferred embodiment are compared with band pass characteristics of the Band 66 reception filter according to the comparative example.

As illustrated in FIGS. 16A to 16D, the multiplexer 1 provides significantly improved band pass characteristics compared to the multiplexer 1a. In particular, insertion loss of the Band 66 reception filter 14 with the highest center frequency is significantly reduced, and band pass characteristics are significantly improved. In addition, there is substantially no difference in insertion loss between the Band 66 transmission filter 13 with the lowest center frequency of the multiplexer 1 according to the second preferred embodiment and that of the multiplexer 1a according to the comparative example. Further, insertion losses of the Band 25 transmission filter 11 and the Band 25 reception filter 12 are significantly reduced, and band pass characteristics are significantly improved.

Figure 17A:
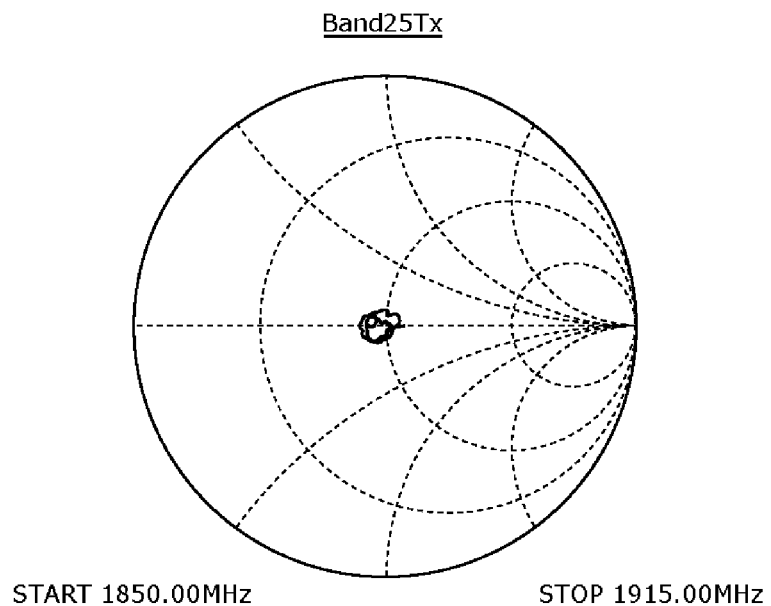
FIG. 17A is a Smith chart illustrating complex impedance viewed from a transmission output terminal of the Band 25 transmission filter according to the second preferred embodiment of the present invention alone.
Figure 17B:
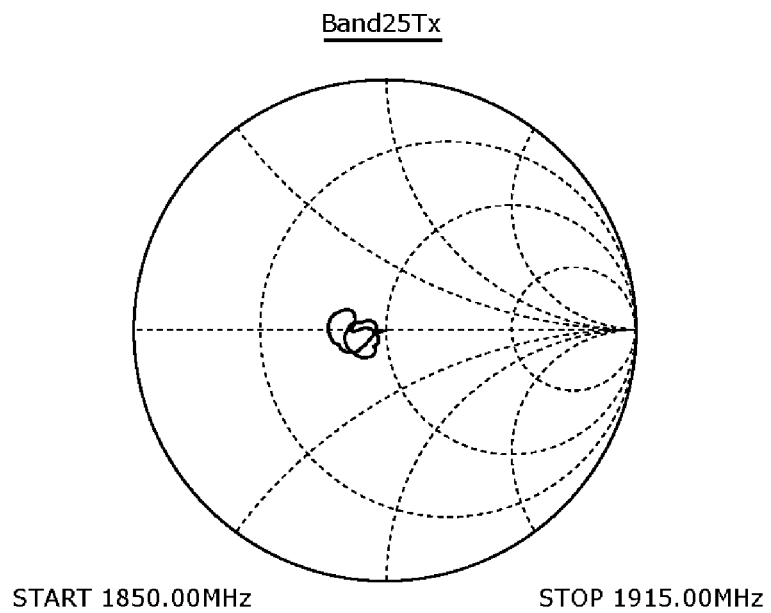
FIG. 17B is a Smith chart illustrating complex impedance viewed from a transmission output terminal of the Band 25 transmission filter according to the comparative example of the second preferred embodiment of the present invention alone.
Figure 18A:
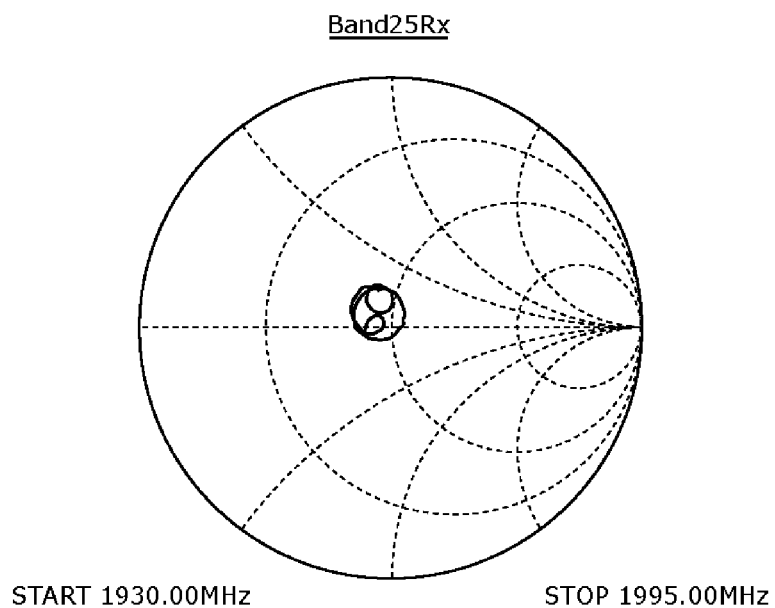
FIG. 18A is a Smith chart illustrating complex impedance viewed from a reception input terminal of the Band 25 reception filter according to the second preferred embodiment of the present invention alone.
Figure 18B:
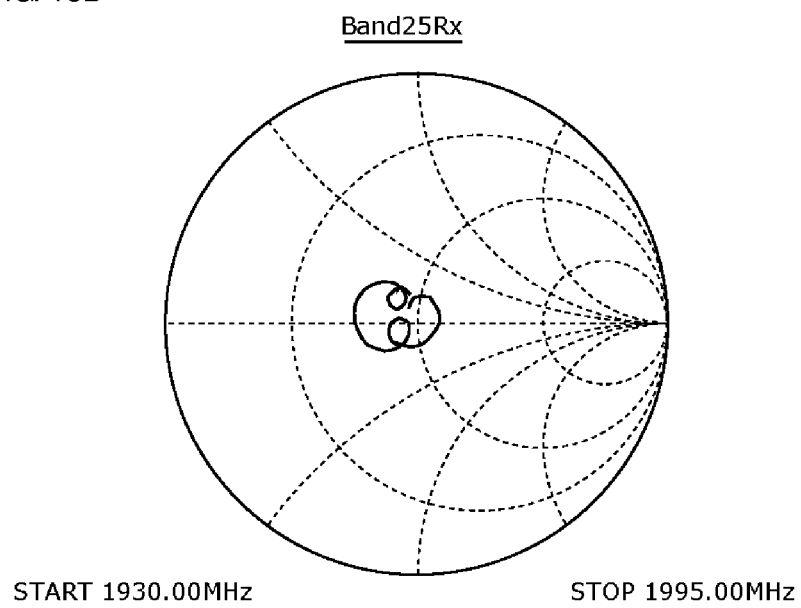
FIG. 18B is a Smith chart illustrating complex impedance viewed from a reception input terminal of the Band 25 reception filter according to the comparative example of the second preferred embodiment of the present invention alone.
Figure 19A:
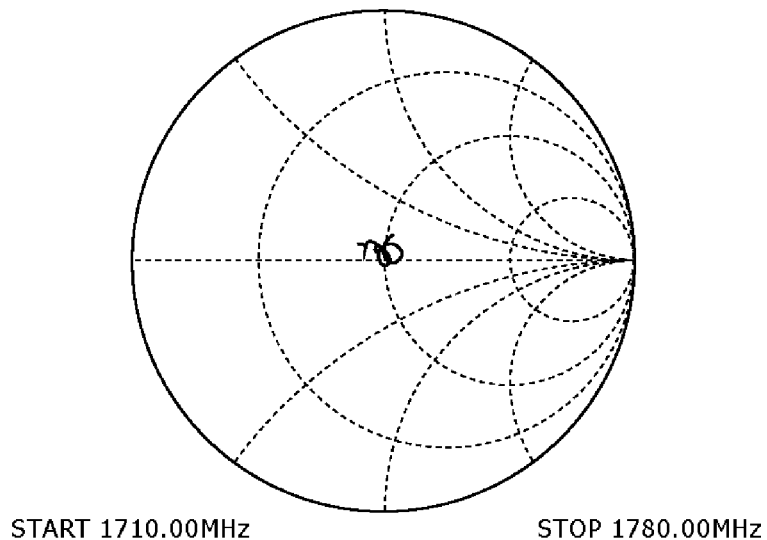
FIG. 19A is a Smith chart illustrating complex impedance viewed from a transmission output terminal of the Band 66 transmission filter according to the second preferred embodiment of the present invention alone.
Figure 19B:
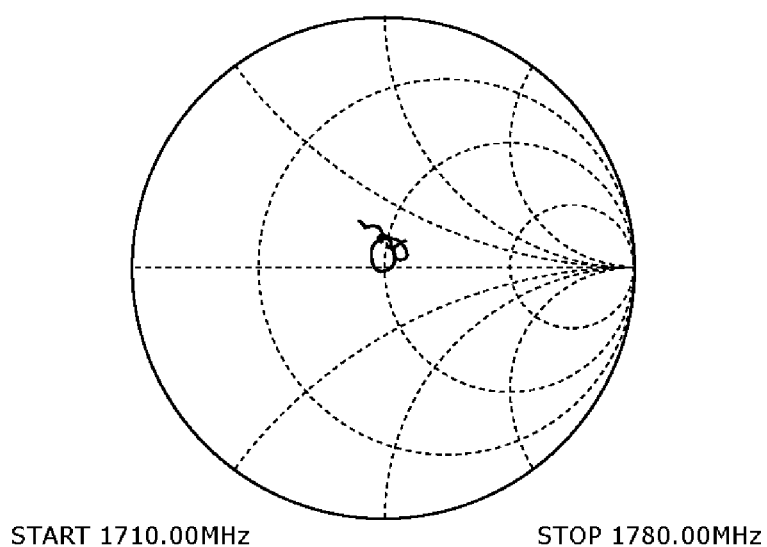
FIG. 19B is a Smith chart illustrating complex impedance viewed from a transmission output terminal of the Band 66 transmission filter according to the comparative example of the second preferred embodiment of the present invention alone.
Figure 20A:
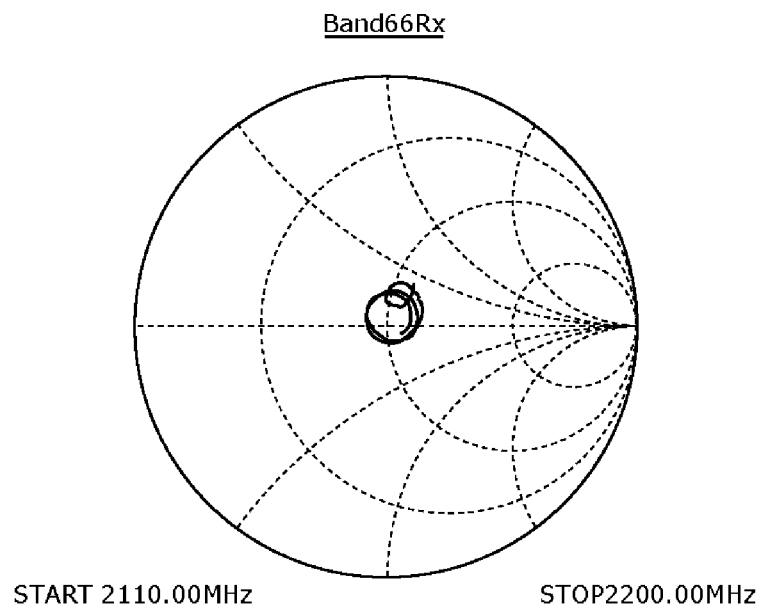
FIG. 20A is a Smith chart illustrating complex impedance viewed from a reception input terminal of the Band 66 reception filter according to the second preferred embodiment of the present invention alone.
Figure 20B:
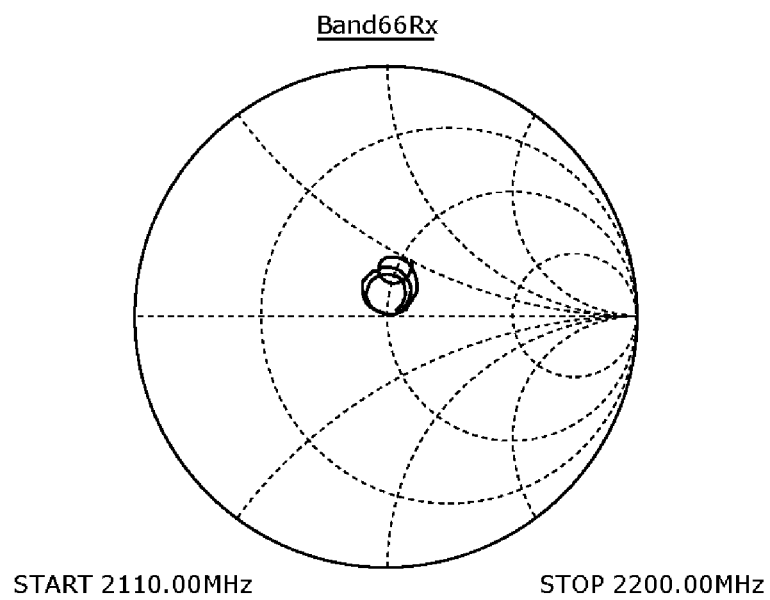
FIG. 20B is a Smith chart illustrating complex impedance viewed from a reception input terminal of the Band 66 reception filter according to the comparative example of the second preferred embodiment of the present invention alone.

FIGS. 17A and 17B are Smith charts illustrating complex impedances viewed from the transmission output terminals 61 of the Band 25 transmission filters 11 alone of the multiplexers 1 and 1a, respectively. FIGS. 18A and 18B are Smith charts illustrating complex impedances viewed from the reception input terminals 62 of the Band 25 reception filters 12 alone of the multiplexers 1 and 1a, respectively. FIGS. 19A and 19B are Smith charts illustrating complex impedances viewed from the transmission output terminals 63 of the Band 66 transmission filters 13 alone of the multiplexers 1 and 1a, respectively. FIGS. 20A and 20B are Smith charts illustrating complex impedances viewed from the reception input terminals 64 of the Band 66 reception filters 14 alone of the multiplexers 1 and 1a, respectively.

The complex impedances viewed from the common terminal 50 of the transmission filters 11 and 13 and the reception filters 12 and 14 of the multiplexer 1, which are illustrated in FIGS. 17A, 18A, 19A, and 20A, are located closer to the characteristic impedance (about 50Ω) illustrated at the center of the Smith charts than the complex impedances of the transmission filters 11 and 13 and the reception filters 12 and 14 of the multiplexer 1a according to the comparative example, which are illustrated in FIGS. 17B, 18B, 19B, and 20B. This thus indicates that significantly improved impedance matching is provided in the multiplexer 1 compared to the multiplexer 1a.

As described above, the multiplexer 1 is able to provide significantly improved impedance matching at the common terminal 50 and decrease insertion loss of the reception filter 14 with the highest center frequency by setting the length of the wiring disposed between the reception filter 14 with the highest center frequency and the common terminal 50 shorter than the length of the wiring disposed between the transmission filter 13 with the lowest center frequency and the common terminal 50.

The reason for this will be described below with reference to FIG. 21. FIG. 21 is a Smith chart that describes a change in complex impedance viewed from the common terminal 50 of the multiplexer 1 when the length of the wiring disposed between the common terminal 50 and each of the transmission filters 11 and 13 and the reception filters 12 and 14 is changed.

When wirings that connect the common terminal 50 and the transmission filters 11 and 13 and the reception filters 12 and 14 to each other are provided in the mounting substrate 6, impedance viewed from the common terminal 50 of the transmission filters 11 and 13 and the reception filters 12 and 14 changes due to the inductance components of the wirings. Specifically, when complex impedance viewed from the common terminal 50 is illustrated in a Smith chart, the complex impedance viewed from the common terminal 50 changes clockwise as indicated by an arrow illustrated in FIG. 21. An amount of this change increases as the center frequency of the filter increases even if the lengths of the wirings disposed between the common terminal 50 and the transmission filters 11 and 13 and the reception filters 12 and 14 are equal or substantially equal to one another.

Since the wiring disposed between the reception filter 14 with the highest center frequency and the common terminal 50 is longer than the wiring disposed between the transmission filter 13 with the lowest center frequency and the common terminal 50 in the multiplexer 1a according to the comparative example, an amount of change in the complex impedance of the reception filter 14 viewed from the common terminal 50 increases. Therefore, differences between the complex impedance of the reception filter 14 viewed from the common terminal 50 and the complex impedances of the transmission filters 11 and 13 and the reception filter 12 viewed from the common terminal 50 increase. Consequently, it becomes difficult to adjust the complex impedance of the multiplexer 1a viewed from the common terminal 50 to match the characteristic impedance.

In contrast, the wiring disposed between the reception filter 14 with the highest center frequency and the common terminal 50 is shorter than the wiring disposed between the transmission filter 13 with the lowest center frequency and the common terminal 50 in the multiplexer 1 according to the second preferred embodiment. Thus, differences between the complex impedance of the reception filter 14 viewed from the common terminal 50 and the complex impedances of the transmission filters 11 and 13 and the reception filter 12 viewed from the common terminal 50 are small, and impedance matching at the common terminal 50 significantly improves in the multiplexer 1 compared with the multiplexer 1a. That is, the complex impedance of the multiplexer 1 viewed from the common terminal 50 is successfully adjusted to match the characteristic impedance easily.

In particular, the Band 66 reception filter 14 with the highest center frequency of the multiplexer 1 provides insertion loss that is significantly improved compared to that of the multiplexer 1a as illustrated in FIG. 16D. This is because the influence of a long wiring on insertion loss is small in a filter with the lowest center frequency but the length of the wiring sensitively affects the insertion loss in a filter with the highest center frequency.

Therefore, a multiplexer that provides good impedance matching at the common terminal 50 connected to the antenna element 2 and that provides good insertion loss of the reception filter 14 with the highest center frequency is successfully implemented by decreasing the length of the wiring of the reception filter 14 with the highest center frequency and by increasing the length of the wiring of the transmission filter 13 with the lowest center frequency as in the multiplexer 1 according to the second preferred embodiment.

Figure 22:
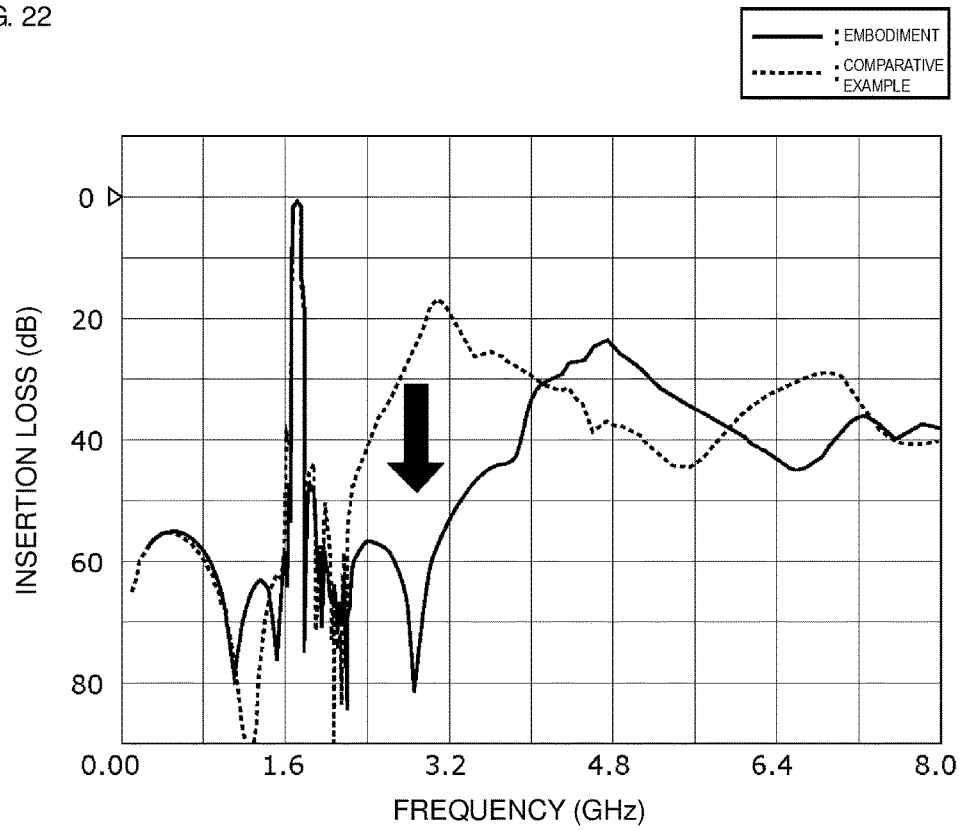
FIG. 22 is a graph in which band pass characteristics of the Band 66 transmission filter according to the second preferred embodiment of the present invention are compared with band pass characteristics of the Band 66 transmission filter according to the comparative example.

FIG. 22 is a graph in which band pass characteristics of the Band 66 transmission filter 13 according to the second preferred embodiment are compared with band pass characteristics of the Band 66 transmission filter according to the comparative example. When the wiring of the transmission filter 13 with the lowest center frequency is long, the frequency of the attenuation pole that occurs on the higher frequency side of the pass band moves towards the lower frequency side because of an inductance component in the mounting substrate 6 and a capacitance component that is naturally caused in the mounting substrate 6 as illustrated in FIG. 22. Consequently, isolation characteristics are significantly improved between the transmission filter 13 with the lowest center frequency and the other filters with center frequencies higher than that of the transmission filter 13.

If the wiring disposed between the transmission filter 13 with the lowest center frequency and the common terminal 50 is too long, the wiring becomes a λ/4 transmission line and a standing wave occurs. Thus, the length of the wiring disposed between the transmission filter 13 with the lowest frequency and the common terminal 50 in the mounting substrate 6 may be less than about λ/4. With the features described above, the occurrence of a standing wave in the wiring disposed between the transmission filter 13 with the lowest center frequency and the common terminal 50 is significantly reduced or prevented.

Other Modifications

While multiplexers according to preferred embodiments of the present invention have been described with respect to the multiplexers including quadplexers, the present invention is not limited to the above preferred embodiments. For example, the preferred embodiments of the present invention include modifications provided by modifying the above preferred embodiments as described below and in other ways.

For example, although 50° Y-X LiTaO$_3$ single crystal is included for the piezoelectric film 53 of the piezoelectric substrate 5 according to the first and second preferred embodiments, the cut-angle of a single crystal material is not limited to this value. That is, the cut-angle of piezoelectric substrates, which are LiTaO$_3$ substrates, of SAW filters included in the multiplexers according to the preferred embodiments is not limited to 50° Y. Even SAW filters including a LiTaO$_3$ piezoelectric substrate including a cut-angle other than the above one are able to provide similar advantageous effects.

The multiplexer 1 according to the preferred embodiments of the present invention may include the inductance element 31 that is connected between ground and a path between the antenna element 2 and the common terminal 50. For example, the multiplexer 1 according to the preferred embodiments of the present invention may include a plurality of SAW filters with characteristics described above and chip inductance elements 21 and 31 are mounted on a high-frequency substrate.

In addition, the inductance elements 21 and 31 may be, for example, chip inductors or may be defined by conductor patterns disposed in or on the high-frequency substrate.

In addition, multiplexers according to preferred embodiments of the present invention are not limited to the quadplexers for Band 25 and Band 66 according to the first and second preferred embodiments.

Figure 23A:
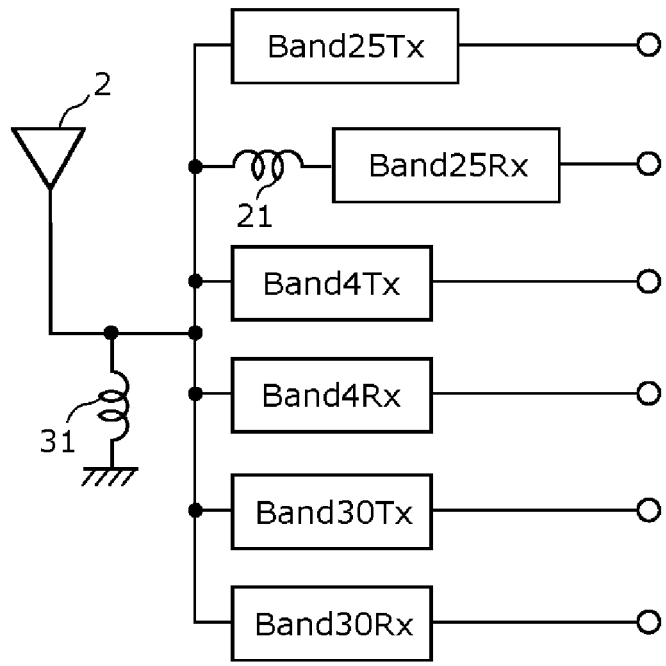
FIG. 23A is a diagram illustrating a multiplexer according to a first modification of the first and second preferred embodiments of the present invention.

FIG. 23A is a diagram illustrating a multiplexer according to a first modification of the first and second preferred embodiments of the present invention. For example, a multiplexer according to preferred embodiments of the present invention may be a hexaplexer that supports six frequency bands and that is applied to a system in which Band 25, Band 4, and Band 30 each providing a transmission band and a reception band are included in combination as illustrated in FIG. 23A. In this case, the inductance element 21 is connected in series to the Band 25 reception filter, and a parallel resonator is connected to the reception input terminal of the Band 25 reception filter. Further, no parallel resonator is connected but a series resonator is connected to terminals of the five filters other than the Band 25 reception filter that are connected to the common terminal.

Figure 23B:
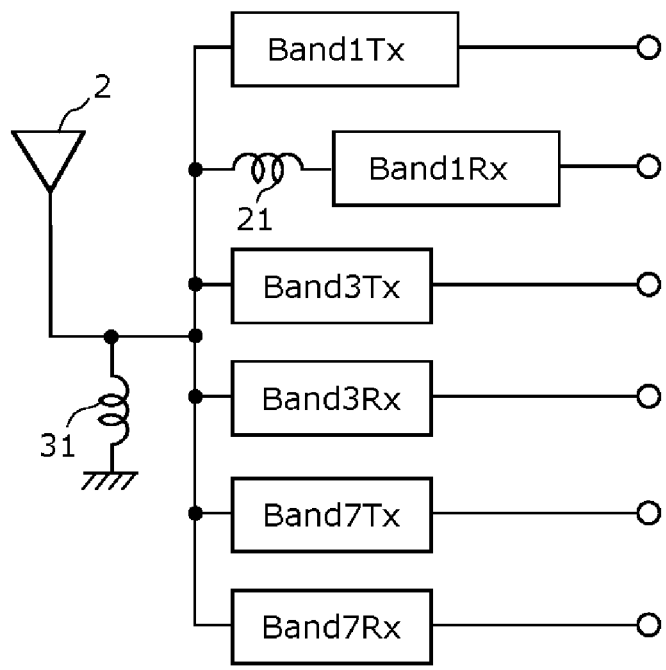
FIG. 23B is a diagram illustrating a multiplexer according to a second modification of the first and second preferred embodiments of the present invention.

FIG. 23B is a diagram illustrating a multiplexer according to a second modification of the first and second preferred embodiments of the present invention. For example, a multiplexer according to preferred embodiments of the present invention may be a hexaplexer that supports six frequency bands and that is applied to a system in which Band 1, Band 3, and Band 7 each providing a transmission band and a reception band are included in combination as illustrated in FIG. 23B. In this case, for example, the inductance element 21 is connected in series to the Band 1 reception filter, and a parallel resonator is connected to the reception input terminal of the Band 1 reception filter. Further, no parallel resonator is connected but a series resonator is connected to terminals of the five filters other than the Band 1 reception filter that are connected to the common terminal.

As described before, insertion loss in the pass band is significantly reduced more as the number of elastic wave filters, which are components, increases in multiplexers according to preferred embodiments of the present invention, compared with multiplexers including matching methods of the related art.

Further, multiplexers according to preferred embodiments of the present invention need not include a plurality of duplexers that perform transmission and reception. For example, a multiplexer according to preferred embodiments of the present invention may be implemented as a transmission apparatus that provides a plurality of transmission frequency bands. That is, a multiplexer according to preferred embodiments of the present invention may be a transmission apparatus that receives a plurality of high-frequency signals with carrier frequency bands different from one another, performs filtering on the plurality of high-frequency signals, and wirelessly transmits the resultant signal from a single antenna element. The transmission apparatus may include a plurality of transmission elastic wave filters each of which receives the plurality of high-frequency signals from a transmission circuit and passes therethrough a signal of a predetermined frequency band; and a common terminal connected to an antenna element by a connection path, a first inductance element being connected between the connection path and a reference terminal. Each of the plurality of transmission elastic wave filters includes at least one of a series resonator that is connected between an input terminal and an output terminal of the transmission elastic wave filter and that includes IDT electrodes disposed on a piezoelectric substrate, and a parallel resonator that is connected between the reference terminal and an electrical path connecting the input terminal and the output terminal to each other and that includes IDT electrodes disposed on the piezoelectric substrate. In addition, an output terminal of one transmission elastic wave filter among the plurality of transmission elastic wave filters is connected to the common terminal with a second inductance element, which is connected to the output terminal and the common terminal, interposed therebetween, and is connected to the parallel resonator. On the other hand, each of output terminals of the transmission elastic wave filters other than the one transmission elastic wave filter is connected to the common terminal and is connected to the series resonator among the series resonator and the parallel resonator.

Further, a multiplexer according to preferred embodiments of the present invention may be implemented as a reception apparatus that provides a plurality of reception frequency bands. That is, a multiplexer according to preferred embodiments of the present invention may be a reception apparatus that receives, via an antenna element, a plurality of high-frequency signals with carrier frequency bands different from one another, performs demultiplexing on the plurality of high-frequency signals, and outputs the resultant signals to a reception circuit. The reception apparatus may include a plurality of reception elastic wave filters each of which receives the plurality of high-frequency signals from the antenna element and passes therethrough a signal of a predetermined frequency band; and a common terminal that is connected to an antenna element by a connection path, a first inductance element being connected between the connection path and a reference terminal. Each of the plurality of reception elastic wave filters includes at least one of a series resonator that is connected between an input terminal and an output terminal of the reception elastic wave filter and that includes IDT electrodes disposed on a piezoelectric substrate and a parallel resonator that is connected between the reference terminal and an electrical path connecting the input terminal and the output terminal to each other and that includes IDT electrodes disposed on the piezoelectric substrate. In addition, an input terminal of one reception elastic wave filter among the plurality of reception elastic wave filters is connected to a common terminal with a second inductance element, which is connected to the input terminal and the common terminal, interposed therebetween and is connected to the parallel resonator. On the other hand, each of input terminals of the reception elastic wave filters other than the one reception elastic wave filter is connected to the common terminal and is connected to the series resonator among the series resonator and the parallel resonator.

The transmission apparatus and the reception apparatus including the features described above also provide advantageous effects similar to those of the multiplexer 1 according to the first and second preferred embodiments.

In addition, preferred embodiments of the present invention are embodied not only as a multiplexer, a transmission apparatus, and a reception apparatus that include elastic wave filters and inductance elements with characteristics described above but also as an impedance matching method for a multiplexer including the characteristic elements described above as steps thereof.

Figure 24:
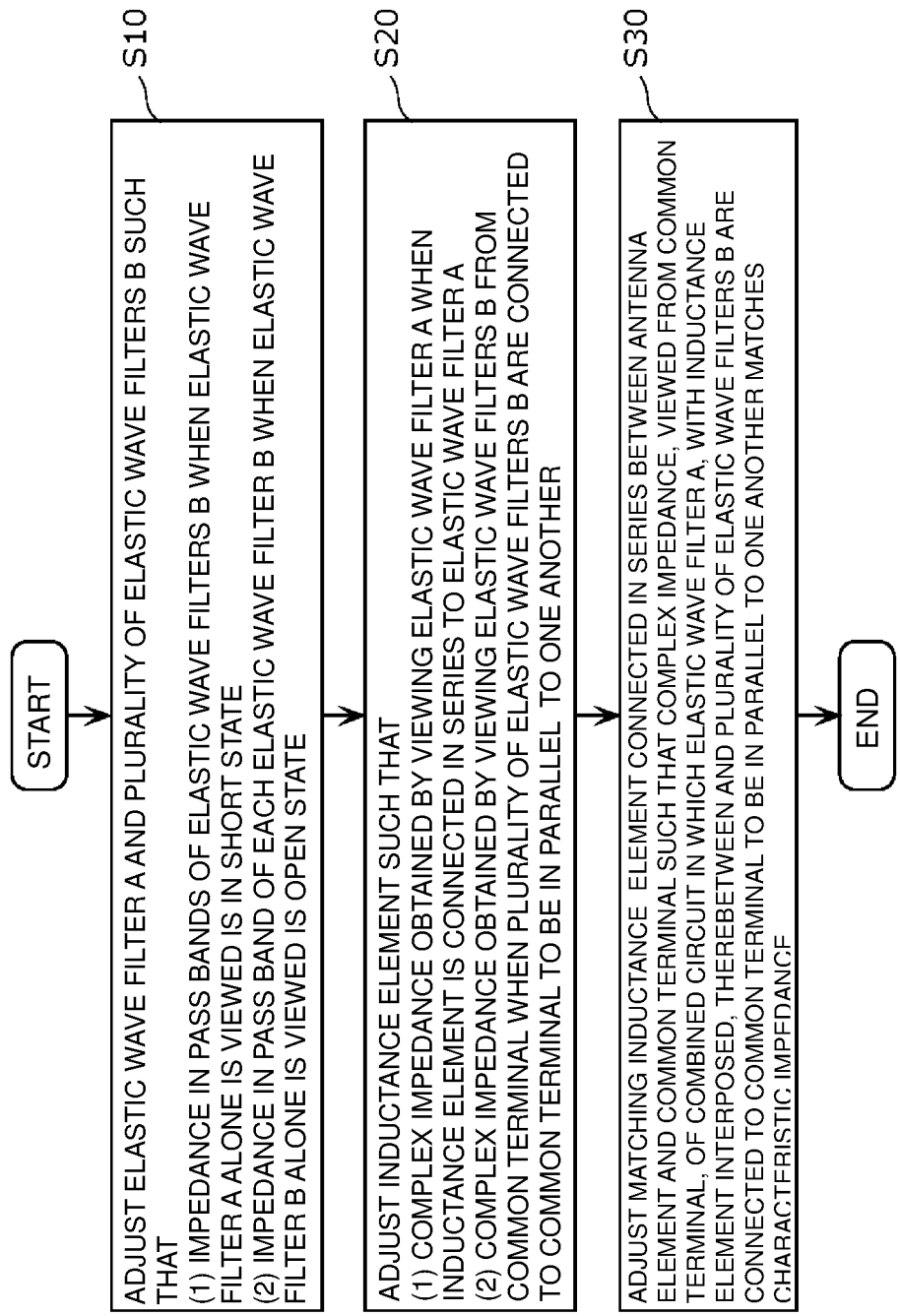
FIG. 24 is an operation flowchart describing an impedance matching method for the multiplexer according to the first and second preferred embodiments of the present invention.

FIG. 24 is an operation flowchart describing an impedance matching method for a multiplexer according to a preferred embodiment of the present invention.

The impedance matching method for a multiplexer according to a preferred embodiment of the present invention includes (1) a step (S10) of adjusting a plurality of elastic wave filters that provides, when one elastic wave filter (elastic wave filter A) among a plurality of elastic wave filters with pass bands different from one another is viewed from one of an input terminal and an output terminal of the one elastic wave filter, a complex impedance in the pass bands of the other elastic wave filters is in a short state and, when each of the other elastic wave filters (elastic wave filters B) other than the one elastic wave filter is viewed from one of an input terminal and an output terminal of the other elastic wave filter, complex impedance in the pass band of the other elastic wave filter is in an open state; (2) a step (S20) of adjusting an inductance value of a filter-adjustment inductance element that provides the complex impedance when the one elastic wave filter (elastic wave filter A) is viewed from the filter-adjustment inductance element side in the case where the filter-adjustment inductance element is connected in series to the one elastic wave filter and the complex impedance obtained when each of the other elastic wave filters (elastic wave filters B) is viewed from a common terminal side in the case where the other elastic wave filters other than the one elastic wave filter are connected to the common terminal to be in parallel to one another provide a relationship of complex conjugates; and (3) a step (S30) of adjusting an inductance value of an antenna-adjustment inductance element connected between a reference terminal and a connection path of an antenna element and the common terminal that provides a complex impedance, viewed from the common terminal, of a combined circuit in which the one elastic wave filter (elastic wave filter A) is connected to the common terminal with the filter-adjustment inductance element interposed therebetween and the other elastic wave filters (elastic wave filters B) are connected to the common terminal to be in parallel to one another matches characteristic impedance. In addition, (4) in the step of adjusting the plurality of elastic wave filters, among the plurality of elastic wave filters each of which includes at least one of a series resonator that is connected between the input terminal and the output terminal of the elastic wave filter and that includes IDT electrodes disposed on a piezoelectric substrate, and a parallel resonator that is connected between the reference terminal and an electrical path connecting the input terminal and the output terminal to each other and that includes IDT electrodes disposed on the piezoelectric substrate, the parallel resonator is connected to the filter-adjustment inductance element in the one elastic wave filter and the series resonator among the parallel resonator and the series resonator is connected to the common terminal in each of the other elastic wave filters.

With the features described above, insertion loss in a pass band of each filter is significantly reduced even when an inductance element with a low Q factor is included.

In addition, in the preferred embodiments described above, SAW filters including IDT electrodes are described as examples of the transmission filters and the reception filters of the multiplexer including a quadplexer, the transmission apparatus, and the reception apparatus. However, filters of the multiplexer including a quadplexer, the transmission apparatus, and the reception apparatus according to the preferred embodiments of the present invention may be elastic wave filters that include series resonators and parallel resonators and that use boundary acoustic waves and bulk acoustic waves (BAW). With the filters described above, advantageous effects similar to those provided by the multiplexer including a quadplexer, the transmission apparatus, and the reception apparatus according to the preferred embodiments are also provided.

In addition, the arrangement in which the inductance element 21 is connected in series to the reception filter 12 in the multiplexer 1 according to the above preferred embodiments has been described. However, the present invention also encompasses an arrangement in which the inductance element 21 is connected in series to the transmission filter 11 or 13 or the reception filter 14. That is, a multiplexer according to a preferred embodiment of the present invention includes a plurality of elastic wave filters with pass bands different from one another; a common terminal connected to an antenna element by a connection path, a first inductance element being connected in series to the connection path; and a second inductance element, in which an output terminal of a transmission filter among the plurality of elastic wave filters may be connected to a parallel resonator and connected to the common terminal with the second inductance element interposed therebetween, the second inductance element being connected to the output terminal and the common terminal; and each of terminals close to the antenna element among input terminals and output terminals of elastic wave filters other than the transmission filter may be connected to the common terminal and connected to a series resonator among the series resonator and the parallel resonator. With the features described above, a low-loss multiplexer is able to be provided even if the number of bands and the number of modes to be supported increase.

Preferred embodiments of the present invention are widely applied to communication devices, for example, cellular phones as a low-loss multiplexer, transmission apparatus, or reception apparatus that is applicable to multiband and multimode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives a plurality of high-frequency signals via an antenna element, the multiplexer comprising:
   a plurality of elastic wave filters that have pass bands different from one another; and
   a common terminal that is connected to the antenna element by a connection path, a first inductance element being connected between the connection path and a reference terminal; wherein
   each of the plurality of elastic wave filters includes at least one of a series resonator connected between an input terminal and an output terminal of each of the plurality of elastic wave filters, and a parallel resonator connected between the reference terminal and a connection path connecting the input terminal and the output terminal to each other;
   a terminal closer to the antenna element among the input terminal and the output terminal of one elastic wave filter among the plurality of elastic wave filters is connected to the parallel resonator and is connected to the common terminal with a second inductance element interposed therebetween; and
   a terminal closer to the antenna element among the input terminal and the output terminal of each of other elastic wave filters other than the one elastic wave filter among the plurality of elastic wave filters is connected to the common terminal and the series resonator.

2. The multiplexer according to claim 1, wherein the second inductance element is connected to the terminal of the one elastic wave filter that is closer to the antennal element, so that impedance in bands other than a pass band of the one elastic wave filter becomes inductive.

3. The multiplexer according to claim 1, wherein the first inductance element and the second inductance element are included in a mounting substrate on which the plurality of elastic wave filters are mounted.

4. The multiplexer according to claim 3, wherein a direction in which a wiring of the first inductance element is wound is identical to a direction in which a wiring of the second inductance element is wound in the mounting substrate.

5. The multiplexer according to claim 1, wherein characteristic impedance R+jX [Ω] viewed from the common terminal of all the plurality of elastic wave filters before the first inductance element is connected satisfies about 40≤R≤about 60 and about −40≤X<about 0.

6. The multiplexer according to claim 1, wherein another elastic wave filter that is to be isolated from the one elastic wave filter among the plurality of elastic wave filters includes a third inductance element connected in series or parallel to a terminal opposite to the terminal closer to the antenna element.

7. The multiplexer according to claim 1, wherein complex impedance in a predetermined pass band provided when the one elastic wave filter is viewed through the second inductance element in a state in which the second inductance element and the terminal closer to the antenna element among the input terminal and the output terminal of the one elastic wave filter are connected in series to each other and complex impedance in the predetermined pass band provided when the other elastic wave filters other than the one elastic wave filter are viewed from the terminals closer to the antenna element to which the common terminal is connected in a state in which the terminals closer to the antenna element among the input terminals and the output terminals of the other elastic wave filters other than the one elastic wave filter are connected to the common terminal provide a relationship of complex conjugates.

8. The multiplexer according to claim 3, wherein
a first filter with a highest center frequency among the other elastic wave filters among the plurality of elastic wave filters includes a shortest wiring disposed between the first filter and the common terminal in the mounting substrate; and
a second filter with a lowest center frequency among the other elastic wave filters other than the one elastic wave filter among the plurality of elastic wave filters includes a longest wiring disposed between the second filter and the common terminal in the mounting substrate.

9. The multiplexer according to claim 8, wherein a length of the wiring of the second filter in the mounting substrate is less than about $\lambda/4$.

10. The multiplexer according to claim 1, wherein a piezoelectric substrate included in each of the plurality of elastic wave filters includes:
a piezoelectric film including interdigital transducer electrodes on one surface thereof;
a high-acoustic-velocity supporting substrate through which a bulk wave propagates at an acoustic velocity higher than an acoustic velocity of an elastic wave that propagates through the piezoelectric film; and
a low-acoustic-velocity film that is disposed between the high-acoustic-velocity supporting substrate and the piezoelectric film and through which a bulk wave propagates at an acoustic velocity lower than the acoustic velocity of the elastic wave that propagates through the piezoelectric film.

11. The multiplexer according to claim 1, wherein the multiplexer includes, as the plurality of elastic wave filters:
a first elastic wave filter that provides a first pass band and that outputs a transmission signal to the antenna element;
a second elastic wave filter that provides a second pass band adjacent to or in a vicinity of the first pass band and that receives a reception signal from the antenna element;
a third elastic wave filter that provides a third pass band lower than the first pass band and the second pass band and that outputs a transmission signal to the antenna element; and
a fourth elastic wave filter that provides a fourth pass band higher than the first pass band and the second pass band and that receives a reception signal from the antenna element; wherein
an elastic wave filter to which the second inductance element is connected in series is at least one of the second elastic wave filter and the fourth elastic wave filter.

12. A transmission apparatus that receives a plurality of high-frequency signals with carrier frequency bands different from one another, performs filtering on the plurality of high-frequency signals, and wirelessly transmits a resultant signal from a single antenna element, the transmission apparatus comprising:
a plurality of transmission elastic wave filters each of which receives the plurality of high-frequency signals from a transmission circuit and passes therethrough a signal of a predetermined frequency band; and
a common terminal connected to the antenna element by a connection path, a first inductance element being connected between the connection path and a reference terminal; wherein
each of the plurality of transmission elastic wave filters includes at least one of a series resonator connected between an input terminal and an output terminal of the transmission elastic wave filter, and a parallel resonator connected between the reference terminal and a connection path connecting the input terminal and the output terminal to each other;
an output terminal of one transmission elastic wave filter among the plurality of transmission elastic wave filters is connected to the parallel resonator and is connected to the common terminal with a second inductance element interposed therebetween, the second inductance element being connected to the output terminal and the common terminal; and
an output terminal of a remainder of the plurality of transmission elastic wave filters other than the one transmission elastic wave filter is connected to the common terminal and is connected to the series resonator among the series resonator and the parallel resonator.

13. A reception apparatus that receives a plurality of high-frequency signals with carrier frequency bands different from one another via an antenna element, performs demultiplexing on the plurality of high-frequency signals, and outputs resultant signals to a reception circuit, the reception apparatus comprising:
a plurality of reception elastic wave filters each of which receives the plurality of high-frequency signals from the antenna element and passes therethrough a signal of a predetermined frequency band; and
a common terminal connected to the antenna element by a connection path, a first inductance element being connected between the connection path and a reference terminal; wherein
each of the plurality of reception elastic wave filters includes at least one of a series resonator connected between an input terminal and an output terminal of the reception elastic wave filter, and a parallel resonator connected between the reference terminal and an electrical path connecting the input terminal and the output terminal to each other;
an input terminal of one reception elastic wave filter among the plurality of reception elastic wave filters is connected to the parallel resonator and is connected to the common terminal with a second inductance element interposed therebetween, the second inductance element being connected to the input terminal and the common terminal; and
an input terminal of a remainder of the plurality of reception elastic wave filters other than the one reception elastic wave filter is connected to the common terminal and is connected to the series resonator among the series resonator and the parallel resonator.

14. An impedance matching method for a multiplexer that transmits and receives a plurality of high-frequency signals via an antenna element, the method comprising:
adjusting a plurality of elastic wave filters having pass bands different from one another that provides, when one elastic wave filter among the plurality of elastic wave filters is viewed from one of an input terminal and an output terminal of the one elastic wave filter, a complex impedance in the pass bands of other elastic wave filters other than the one elastic wave filter among the plurality of elastic wave filters is in a short state and, when each of the other elastic wave filters is viewed from one of an input terminal and an output terminal of the other elastic wave filter, complex impedance in the pass band of the other elastic wave filter is in an open state;

adjusting an inductance value of a filter-adjustment inductance element that provides a complex impedance when the one elastic wave filter is viewed from the filter-adjustment inductance element side in a case where the filter-adjustment inductance element is connected in series to the one elastic wave filter and a complex impedance when the other elastic wave filters are viewed from the common terminal in a case where the other elastic wave filters are connected to the common terminal to be in parallel to one another provide a relationship of complex conjugates; and adjusting an inductance value of an antenna-adjustment inductance element connected between the reference terminal and a connection path connecting the antenna element and the common terminal to each other that provides a complex impedance, viewed from the common terminal, of a combined circuit in which the one elastic wave filter is connected to the common terminal with the filter-adjustment inductance element interposed therebetween and the other elastic wave filters are connected to the common terminal to be in parallel to one another matches characteristic impedance; wherein in the step of adjusting the plurality of elastic wave filters:

among the plurality of elastic wave filters each of which includes at least one of a series resonator connected between an input terminal and an output terminal of the elastic wave filter, and a parallel resonator connected between the reference terminal and an electrical path connecting the input terminal and the output terminal to each other;

the parallel resonator is connected to the filter-adjustment inductance element in the one elastic wave filter; and the series resonator is connected to the common terminal among the parallel resonator and the series resonators in each of the other elastic wave filters.

15. The multiplexer according to claim 1, wherein each of the plurality of elastic wave filters is an unbalanced-input-unbalanced-output band pass filter.

16. The multiplexer according to claim 11, wherein the first elastic wave filter, the third elastic wave filter, and the fourth elastic wave filter are each directly connected to the common terminal.

17. The multiplexer according to claim 10, wherein each of the interdigital transducer electrodes includes a plurality of electrode fingers that are parallel or substantially parallel to one another and a busbar electrode that connects the plurality of electrode fingers to one another.

18. The multiplexer according to claim 10, wherein
each of the interdigital transducer electrodes includes a stacked structure including a close-contact layer, a main electrode layer, and a protection layer;
the close-contact layer connects the main electrode layer to the piezoelectric substrate; and
the protection layer protects the main electrode layer.

19. The multiplexer according to claim 1, wherein each of the plurality of elastic wave filters includes at least two series resonators connected in series to one another between the input terminal and the output terminal, and at least two parallel resonators connected between the reference terminal and a connection path connecting the input terminal and the output terminal to each other.

20. The multiplexer according to claim 1, wherein
the mounting substrate includes a multiplayer structure in which a plurality of printed circuit board layers are stacked; and
the first inductance element and the second inductance element are included in the mounting substrate.

* * * * *